United States Patent
Gonzalez-Martin et al.

(10) Patent No.: US 6,520,839 B1
(45) Date of Patent: *Feb. 18, 2003

(54) LOAD AND UNLOAD STATION FOR SEMICONDUCTOR WAFERS

(75) Inventors: Jose R. Gonzalez-Martin, Phoenix, AZ (US); Chris Karlsrud, Chandler, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/518,158

(22) Filed: Mar. 2, 2000

Related U.S. Application Data

(62) Division of application No. 08/926,700, filed on Sep. 10, 1997, now Pat. No. 6,213,853.

(51) Int. Cl.⁷ .................................. B24B 1/00
(52) U.S. Cl. ........................ 451/41; 451/287
(58) Field of Search .................. 451/28, 41, 63, 451/285, 287, 288, 289, 54, 259, 339, 446; 134/84, 94.1, 102.1, 201, 902

(56) References Cited

U.S. PATENT DOCUMENTS

| | | |
|---|---|---|
| 3,939,514 A | 2/1976 | Cook |
| 4,141,180 A | 2/1979 | Gill, Jr. et al. |
| 4,313,266 A | 2/1982 | Tam |
| 4,653,231 A | 3/1987 | Cronkhite et al. |
| 4,680,893 A | 7/1987 | Cronkhite et al. |
| 4,811,522 A | 3/1989 | Gill, Jr. |
| 4,851,101 A | 7/1989 | Hutchinson |
| 5,203,360 A | 4/1993 | Nguyen et al. |
| 5,213,451 A | 5/1993 | Frank et al. |
| 5,329,732 A | 7/1994 | Karlsrud et al. |
| 5,333,413 A | 8/1994 | Hashimoto |
| 5,357,645 A | 10/1994 | Onodera |
| 5,361,545 A | 11/1994 | Nakamura |
| 5,442,828 A | 8/1995 | Lutz |
| 5,498,196 A | 3/1996 | Karlsrud et al. |
| 5,498,199 A | 3/1996 | Karlsrud et al. |
| 5,522,965 A | 6/1996 | Chisholm et al. |
| 5,542,874 A | 8/1996 | Chikaki |
| 5,616,063 A | 4/1997 | Okumura et al. |
| 5,618,227 A | 4/1997 | Tsutsumi et al. |
| 5,655,949 A | 8/1997 | Clover |
| 5,655,954 A | 8/1997 | Oishi et al. |
| 5,692,947 A | 12/1997 | Talieh et al. |
| 5,707,274 A | 1/1998 | Kim et al. |
| 6,213,853 B1 * | 4/2001 | Gonzalez-Martin et al. 451/287 |

FOREIGN PATENT DOCUMENTS

| | | |
|---|---|---|
| EP | 0 412 796 | 2/1991 |
| EP | 0 761 387 | 3/1997 |
| EP | 0 793 261 | 9/1997 |
| EP | 0 795 892 | 9/1997 |
| EP | 0 803 328 | 10/1997 |
| EP | 0 806 265 | 11/1997 |
| EP | 0 807 492 | 11/1997 |
| JP | 2-250324 | 10/1990 |
| WO | WO 95/31309 | 11/1995 |
| WO | WO 96/17711 | 6/1996 |

\* cited by examiner

Primary Examiner—Derris H. Banks
(74) Attorney, Agent, or Firm—Snell & Wilmer, L.L.P.

(57) ABSTRACT

An integral machine for polishing, cleaning, rinsing and drying workpieces such as semiconductor wafers. A load/unload station has a plurality of platforms for receiving cassettes of wafers to be processed. A dry end-effector of a robot retrieves wafers from the cassettes and transfers them to an index table. A transfer apparatus having wafer carrier elements picks up wafers from the index table, moves the wafers to a polishing table for polishing, and returns the wafers to the index table for further processing. A flipper moves the polished wafers to a cleaning station. The cleaning station includes scrub stations, a rinsing station and a spin dryer station, and a connective system of water tracks. A wet end-effector of the robot transfers rinsed wafers to the spin dryer station. The dry end-effector of the robot moves dried wafers from the spin dryer station back to the cassette of origination.

25 Claims, 17 Drawing Sheets

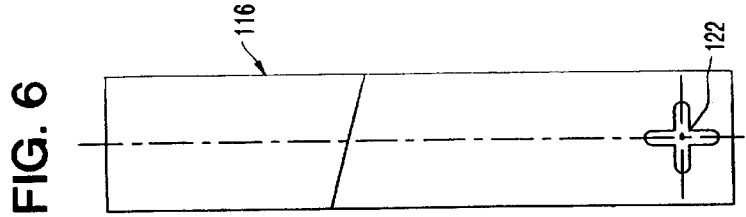
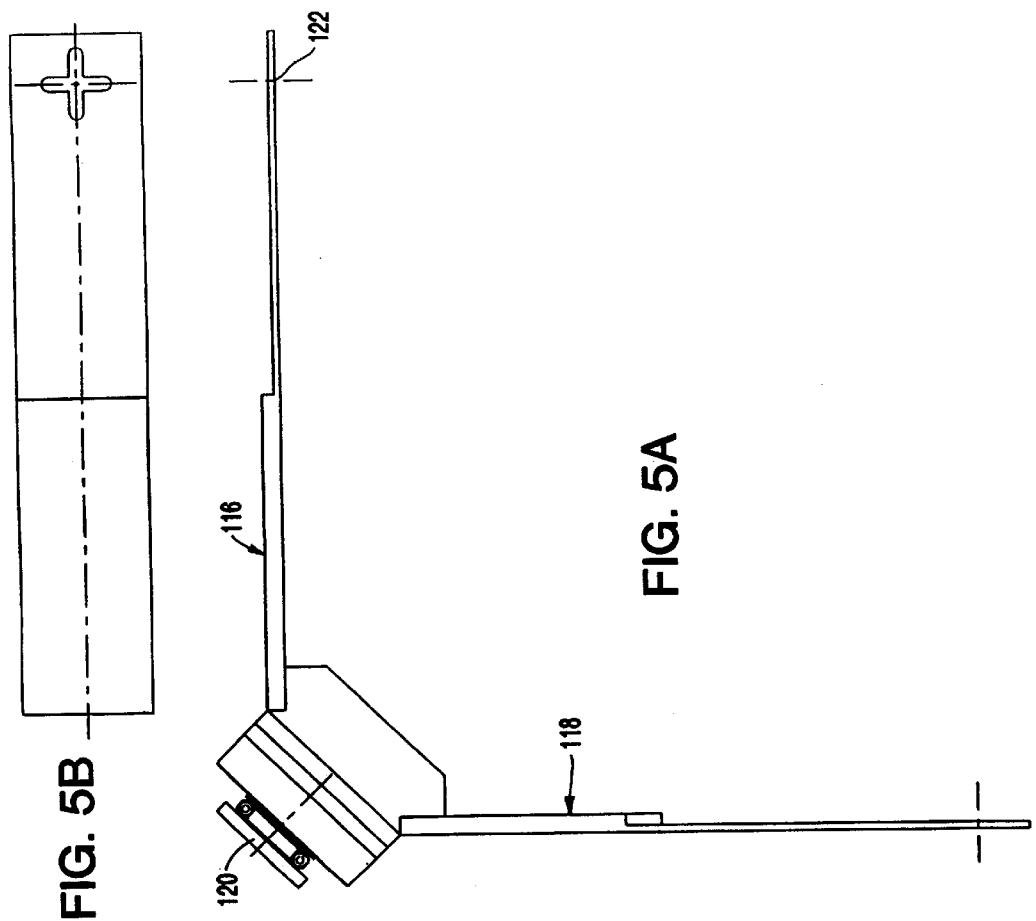

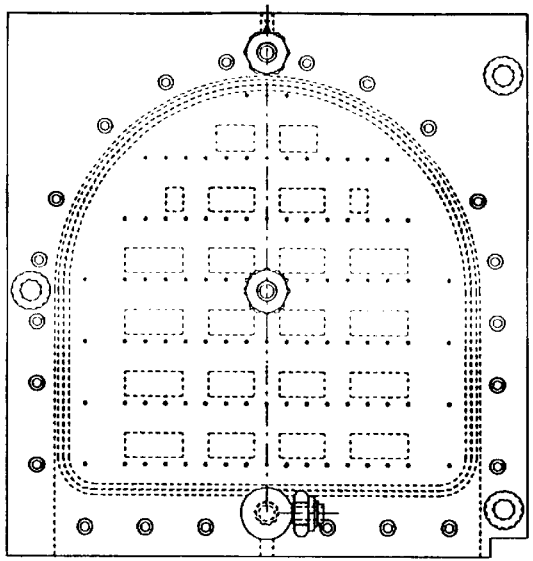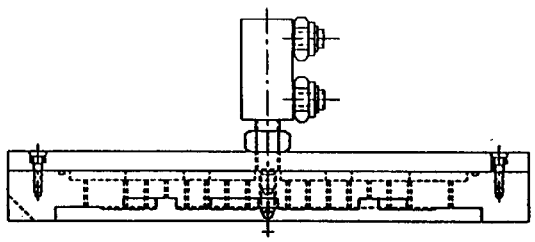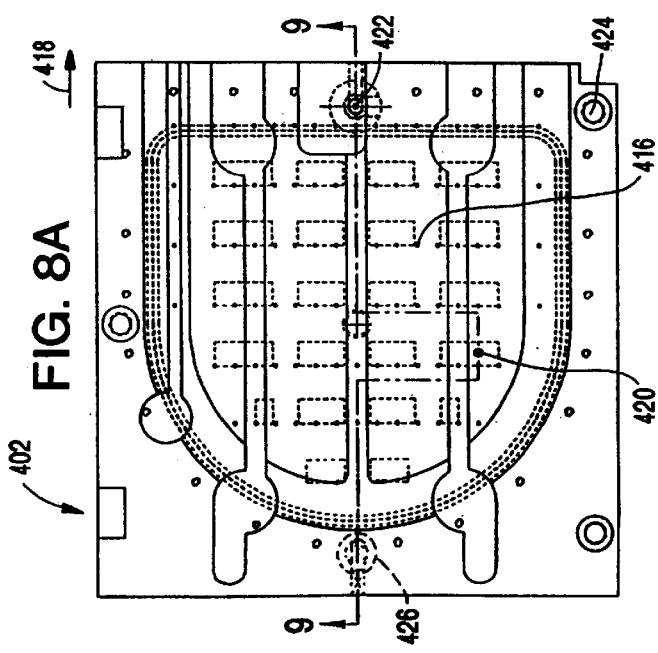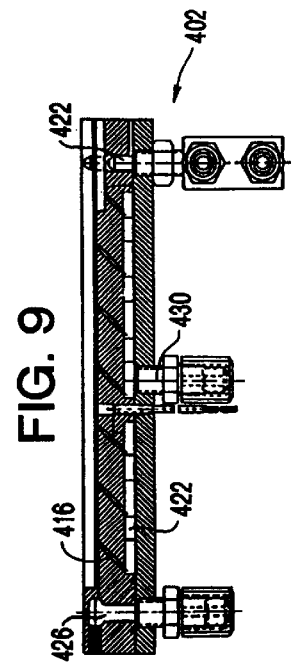

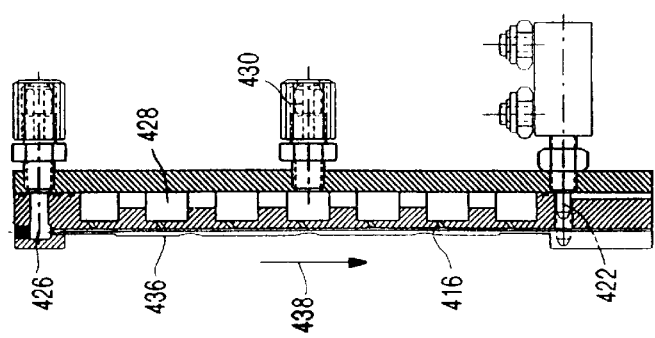
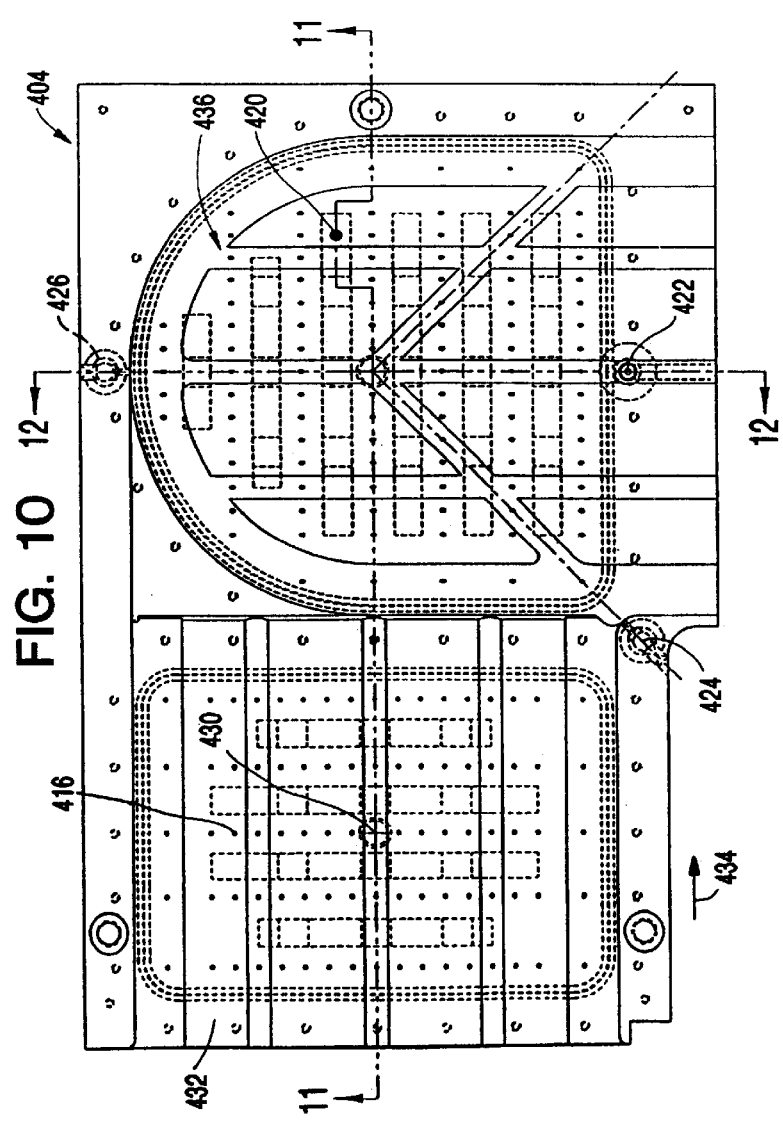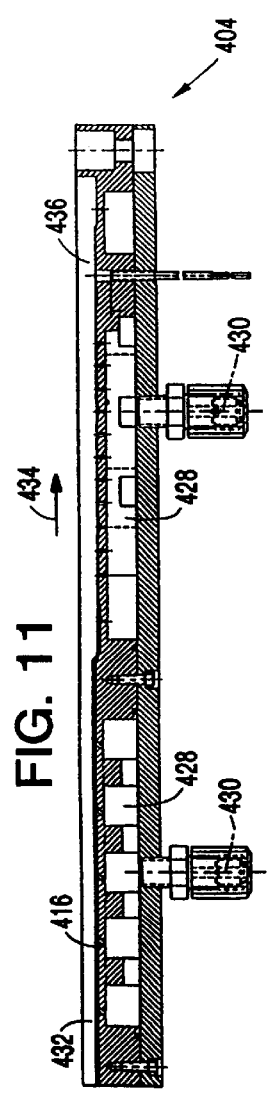

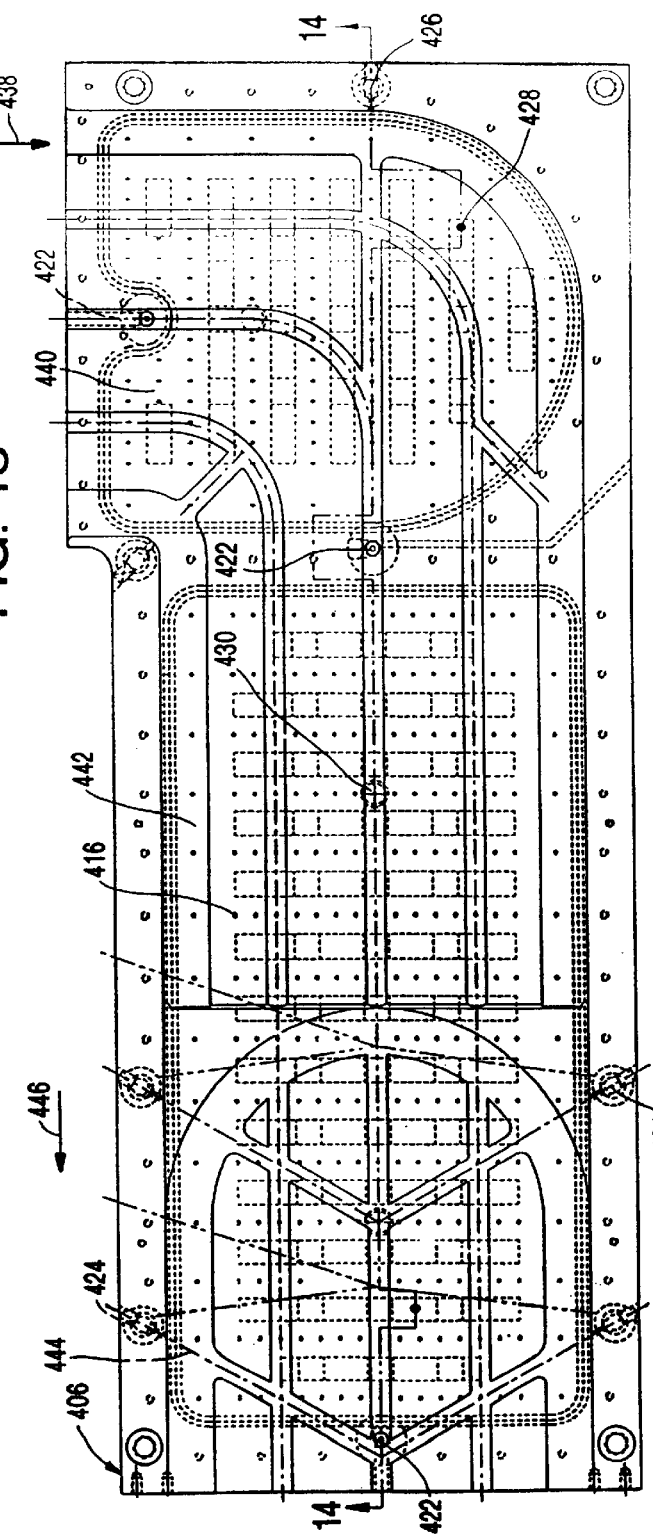
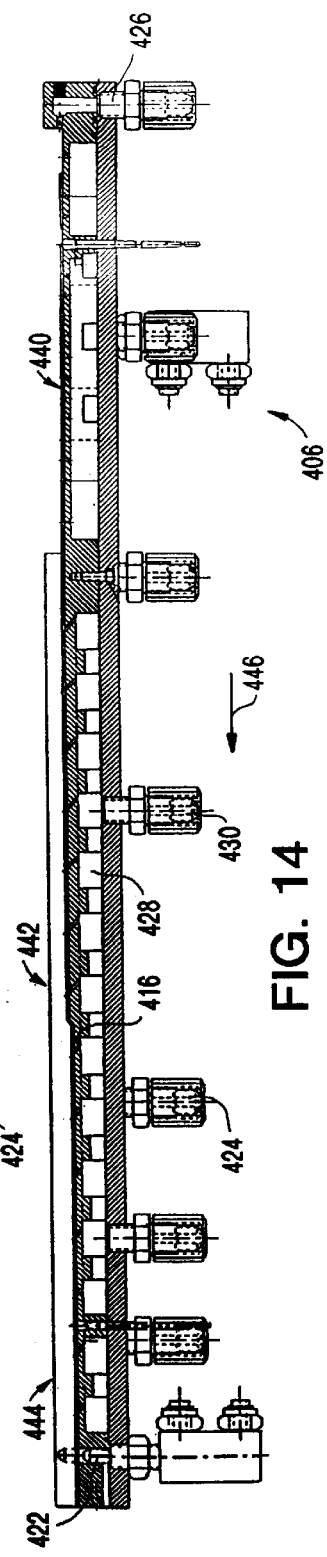
FIG. 13
FIG. 14

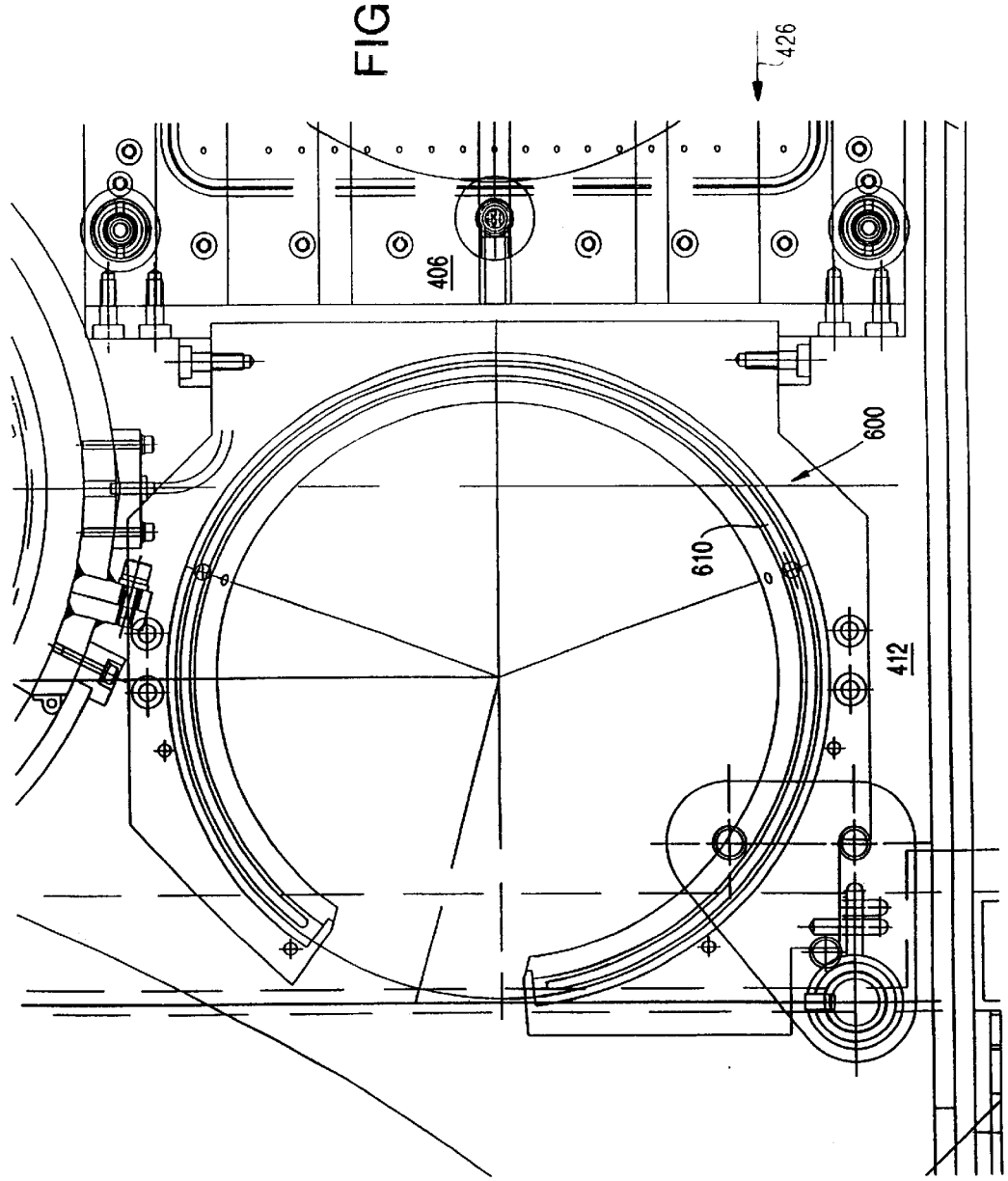

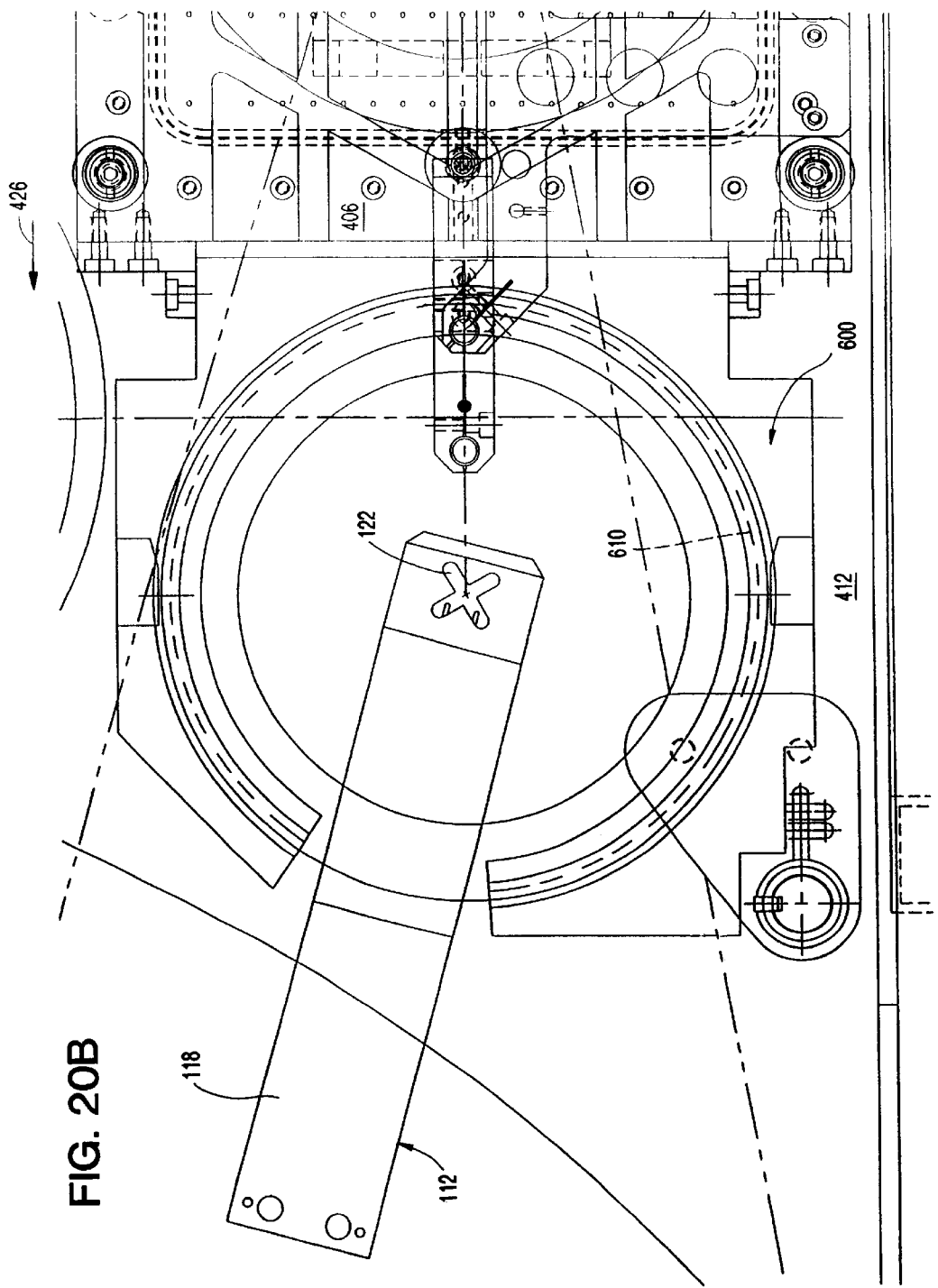

LOAD AND UNLOAD STATION FOR SEMICONDUCTOR WAFERS

STATEMENT OF RELATED APPLICATION

This application is a divisional application of U.S. Ser. No. 08/926,700 filed Sep. 10, 1997, now U.S. Pat. No. 6,213,853.

FIELD OF THE INVENTION

The present invention relates, generally, to a self-contained machine for polishing, cleaning, rinsing, and spin-drying semiconductor wafer workpieces and, more particularly, to an improved system for receiving a cassette of wafers; CMP polishing, cleaning, rinsing and drying the wafers; and returning the polished and cleaned wafers to the same cassette and to the same slot from which they were taken.

BACKGROUND OF THE INVENTION

Machines for polishing and machines for cleaning wafers and disks in the electronics industry are generally well known. For example, semiconductor wafers, magnetic disks, and other workpieces often come in the form of flat, substantially planar, circular disks. In the manufacture of integrated circuits, semiconductor wafer disks are sliced from a silicon ingot and prepared for further processing. After each wafer is sliced from the ingot, it must be thoroughly polished and then cleaned, rinsed, and dried to remove debris from the surface of the wafer. Thereafter, a series of steps are performed on the wafer to build the integrated circuits on the wafer surface, including applying a layer of microelectronic structures and thereafter applying a dielectric layer. Typically, after the layers are fabricated on the wafer surfaces, the wafers must be planarized to remove excess material and imperfections.

After each processing step, it is often desirable to thoroughly clean, rinse, and dry the wafers to ensure that debris is removed from the wafers. Thus, a method and apparatus for quickly and efficiently cleaning, rinsing, and drying wafers is needed which facilitates high wafer throughput, while at the same time thoroughly cleaning and drying the wafers with a minimum of wafer breakage. For a discussion of existing wafer cleaning machines, see, for example, Lutz, U.S. Pat. No. 5,442,828, issued Aug. 22, 1995; Frank et al., U.S. Pat. No. 5,213,451, issued May 25, 1993; and Onodera, U.S. Pat. No. 5,357,645, issued Oct. 25, 1994.

Presently, CMP polishing and/or planarization is performed by one machine and wafer cleaning and drying is performed by another, separate machine. After a processing layer (i.e., oxide, tungsten or the like) has been deposited on the surface of the wafers, the dry wafers are placed in a cassette and hand carried to a CMP polishing machine. The CMP machine removes excess material by planarizing the wafers, and then typically rinses the wafers and places the wafers into a wet cassette. After polishing, residual particles still reside on the wafer's surface. If these particles dry on the wafer prior to cleaning, the microelectronic structures on the wafer may be corrupted. Therefore, it is extremely important to keep the wafers wet prior to cleaning and drying the wafers. From the CMP machine, the wet cassettes are hand carried to a separate wafer cleaning and drying machine which is typically located somewhere near the CMP machine.

This conventional practice of utilizing separate machines for wafer polishing and for wafer cleaning and drying has serious drawbacks. First, wafer manufacturers must have personnel, equipment and facilities on hand to transport wafers in a wet environment from a CMP machine to a cleaning and drying machine. Secondly, having separate machines for polishing wafers and for cleaning wafers consumes a significant amount of clean room space which, as one skilled in the art will appreciate, is very expensive.

SUMMARY OF THE INVENTION

The present invention overcomes the shortcomings of conventional prior art systems by integrating the polishing, cleaning and drying functions in one machine.

Accordingly, a primary object of the present invention is to provide a combined wafer CMP polishing, cleaning and drying machine in which wafers are removed from a dry cassette, polished, cleaned, dried and returned to the same cassette and slot from which they were removed.

Another object of the present invention is to maintain the load station, the cleaning stations and the drying stations of the combined polishing and cleaning machine at a class 1–10 clean room environment. Positive laminar air flow from the load and cleaning stations of the machine into the CMP station of the machine is utilized to maintain the clean environment within the load and cleaning stations. The positive air flow ensures that slurry and other particles that may be liberated from the wafers during polishing do not migrate into or otherwise contaminate the clean environment.

Another aspect of the present invention is utilization of a six-axis robot to remove wafers from a dry cassette and to transport the wafers to an index table within the CMP station of the machine. The robot is also configured to transport wet wafers from a rinse station in the cleaning station of the machine to a spin dryer station also located in the cleaning station. The robot also removes the dry wafers from the spin dryer station and places them back into the cassettes located in the load station of the machine. The robot has a wet end effector and a dry end effector to ensure that wet and dry wafers are isolated during transport. The dry end effector is used to unload and load dry cassettes, and the wet end effector is used to move wet wafers from the rinse station to the spin dryer station.

Another feature of the present invention is a wafer mapping system which determines which slots within a wafer cassette is occupied by wafers. The mapping system also determines whether wafers are properly aligned within the slots and whether more than one wafer is within a particular slot. The mapping system preferably comprises an optical scanning device, such as a video camera, mounted in a mounting bracket attached to a top portion of the robot and a system processor configured to interpret and process the signals from the scanning device. When a cassette is placed on the polishing and cleaning machine, the robot end-effector retrieves the scanning device (camera) from the mounting bracket and traverses up and down in front of the cassette, allowing the optical scanner to view the contents of the cassette. Additionally, a back lighting source behind the cassette may be utilized to increase the effectiveness of the optical scan vision system.

The CMP station is preferably configured to receive and polish five wafers at a time. After the wafers are loaded by the robot onto an index table, a multi-head transport apparatus lowers five wafer carrier heads into proximity with the index table and picks up the wafers. The transport apparatus then moves laterally until it is positioned above a polishing surface. The transport apparatus is then lowered such that the wafers are pressed against the polishing surface. To enhance the polishing process, a polishing slurry is preferably provided, and the individual carriers are rotated on and oscillated radially across the polishing surface. After polishing, the wafers are returned to unload cups in the index table. A flipper apparatus then transfers the wafer from the unload cups to the cleaning station of the machine.

The cleaning station of the machine preferably comprises a water track, cleaning stations, a rinse station, a spin dryer station and a plurality of wafer staging areas. More specifically, when a wafer is first loaded into the cleaning station from the CMP station of the machine, the wafer is held at a first staging area until the machine determines that it is clear to release the wafer. When cleared, water jets urge the wafer into a first cleaning station configured to wash and clean both surfaces of the wafer. From the first cleaning station, the wafer is transported down a water track into a second staging area. Again, the wafer is held at this position until the machine determines that the wafer in front of it has cleared to the next station. From the second staging area, water jets urge the wafer into a second cleaning station for a second cleaning of the wafer. The wafer then exits the second cleaning station into a third staging area. From the third staging area, the wafer is transported down a water track to the rinse station. After rinsing, the robot moves the wafer to the spin dryer station, and then to a cassette.

The wafer cleaning stations preferably comprise a plurality of pairs of rollers which pull the wafers through the cleaning stations and which also clean the top and bottom flat surfaces of the wafers. Various rollers within the roller boxes may operate at different rotational speeds and rotate in different directions. In this manner, certain rollers may function as drive rollers to move wafers through the cleaning stations, while other rollers may function to clean wafer surfaces as the wafers are driven through the cleaning stations.

In a particularly preferred embodiment, the rollers are contained in enclosed boxes which may be easily removed from the machine to facilitate convenient changing of the rollers as the roller surfaces become worn through extended use. A plurality of channels are preferably formed in an upper inside surface of the roller boxes to permit distribution of a plurality of different chemicals (e.g., water, cleaning solutions, surfactants, friction reducing agents, and agents to control the pH of the various solutions) into discrete regions of the roller boxes. In this manner, wafers passing through a first set of rollers may be exposed to a first chemical solution and later exposed to a second chemical solution in a latter stage of the roller box. Since a plurality of roller boxes are preferably employed, different chemicals may be used in different cleaning stations. The first roller box, for example, may distribute a cleaning solution and deionized water mix onto the wafers to facilitate heavier cleaning, while the second roller box may simply distribute deionized water onto the wafers to achieve a rinse.

Wafers are transported from the second cleaning station to the rinse station via a water track. The water track is supported by support posts and the support posts may incorporate a vertical adjustment system for track alignment Wafers are rinsed in a serial manner within the rinse station, which is configured to tilt downward during the rinsing procedure. The downward tilt facilitates effective drainage and removal of any debris or chemicals. A number of water jets urge each wafer into the rinse station, maintain the position of the wafer during rinsing, and perform the rinsing of the upper and lower surfaces of the wafer. The water jets also support the wafer within the rinse station such that mechanical contact with the wafer is minimized.

After rinsing, the robot uses a wet end effector to lift wafers from the rinse station and transfer them to a spin dryer station. The spin dryer station is equipped with a motor which spins a platform holding a wafer at speeds in the range of about 4,000 rpm, to thereby remove residual deionized water from the wafer. The spin dryer station preferably includes a shield around the spinning apparatus to guard other stations of the machine from water and debris that may be shed during the spin-dry process. The shield preferably includes a movable door so that the robot can access the spin dryer. The spin dryer preferably employs a number of gripping fingers configured to maintain the wafer upon the platform during spinning.

The robot uses a dry end effector to retrieve dry wafers from the spin dryer station and to return the dry wafers to the cassette from which they originated. Each wafer is tracked and monitored through the polishing and cleaning steps so that after processing, it can be placed back into its original slot in its original cassette.

A vision system or other position sensing method may be utilized to monitor wafers as they pass through the cleaning station of the machine and to determine if the wafers have properly moved from one area of the cleaning station to the next. Wafers are released from the various staging areas when it is determined that the wafers are all safely positioned within the proper staging areas; that is, when it has determined that lodged wafers are not still in the water track or in the various cleaning, rinsing and drying stations.

The flow of fluids to the wafer index station, polish station and cleaning station may be controlled through use of a fluid flow regulator system, which monitors the flow of fluid, as opposed to prior art systems which typically measure fluid pressure. By measuring fluid flow directly, the system is less susceptible to variations in inlet fluid pressure. Fluid flows within the system may thus be much more accurately controlled than is possible with prior art systems.

The present invention may also incorporate an operator interface such as a flat panel touch screen. The touch screen preferably presents a three-dimensional graphical image of virtually every relevant aspect of the system to facilitate operation, maintenance, trouble-shooting, and the like.

BRIEF DESCRIPTION OF THE DRAWING FIGURES

The present invention will hereinafter be described in conjunction with the appended drawing figures, wherein like numerals generally denote like elements, and:

FIG. 5 is an exploded side view of the two end-effector configuration on the robot of FIG. 4;

FIG. 6 is an exploded plan view of one of the end effectors of FIGS. 4 and 5;

FIG. 8 is an exploded plan view of the first water track of the cleaning station of FIG. 7;

FIG. 9 is a sectional view of the first water track taken through lines 9—9 of FIG. 8;

FIG. 10 is an exploded plan view of the second water track of the cleaning station of FIG. 7;

FIG. 11 is a sectional view of the second water track taken through lines 11—11 of FIG. 10;

FIG. 12 is a sectional view of the second water track taken through lines 12—12 of FIG. 10;

FIG. 13 is an exploded plan view of the third water track of the cleaning station of FIG. 7;

FIG. 14 is a sectional view of the third water track taken through lines 14—14 of FIG. 13;

FIG. 18b is a sectional view of a fluid supply port, manifold and jet which form a part of the rinse station of FIG. 18a;

FIG. 20a is an exploded plan view of the rinse station of FIG. 18 in its configured location proximate the water track;

FIG. 20b is another exploded plan view of the rinse station, depicting entrance of a robot end-effector into the station to retrieve a rinsed wafer;

DETAILED DESCRIPTION OF PREFERRED EMBODIMENTS

Figure 1:
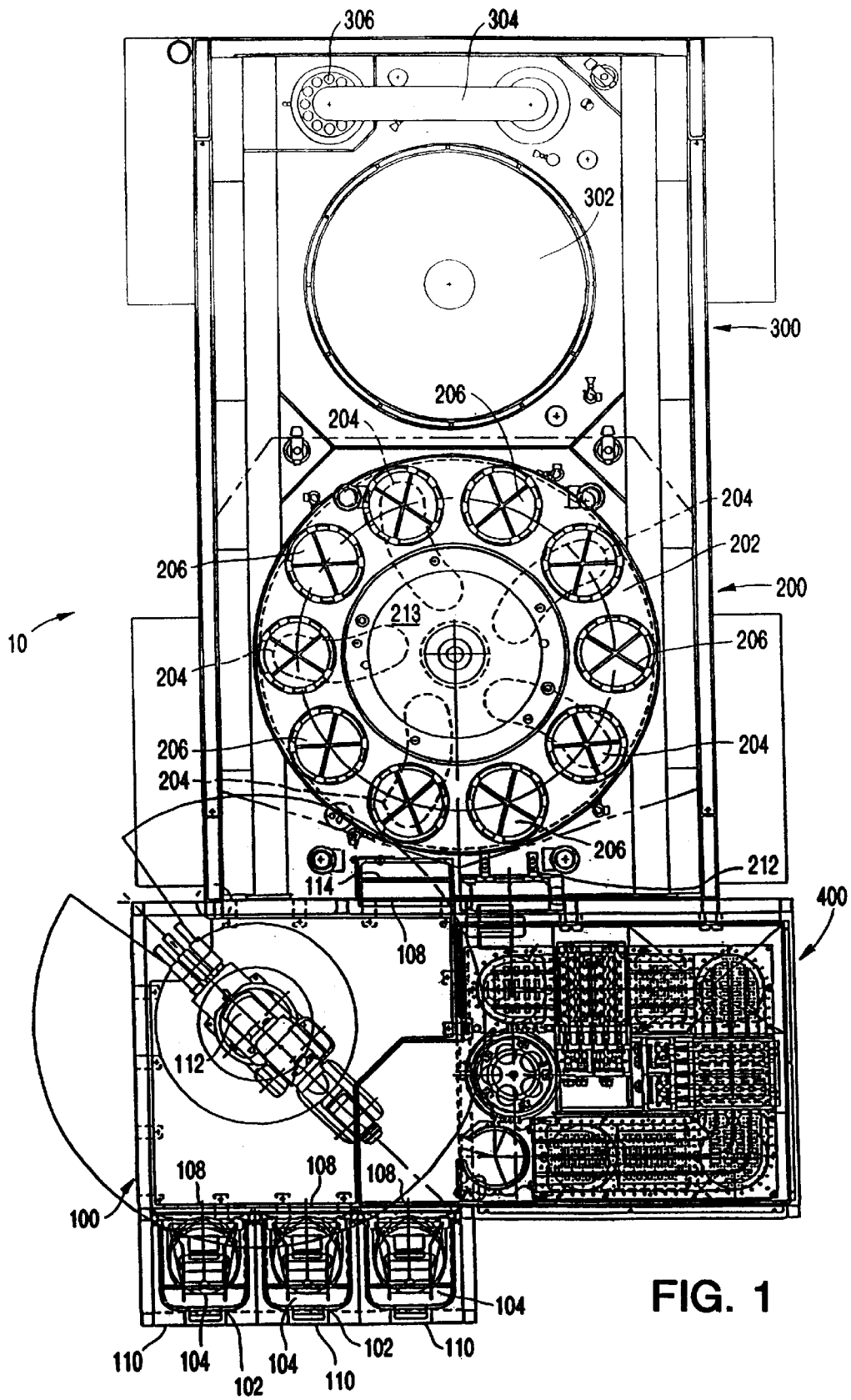
FIG. 1 is a plan view of an integrated machine for polishing, washing, rinsing, spin-drying, and unloading workpieces according to the present invention.

An integrated wafer CMP polishing and cleaning machine 10 according to the present invention is illustrated in FIG. 1. Machine 10 comprises wafer load/unload station 100, wafer index station 200, wafer CMP station 300, and wafer cleaning station 400. Each of the foregoing stations are structurally and functionally described in greater detail below.

Figure 2:
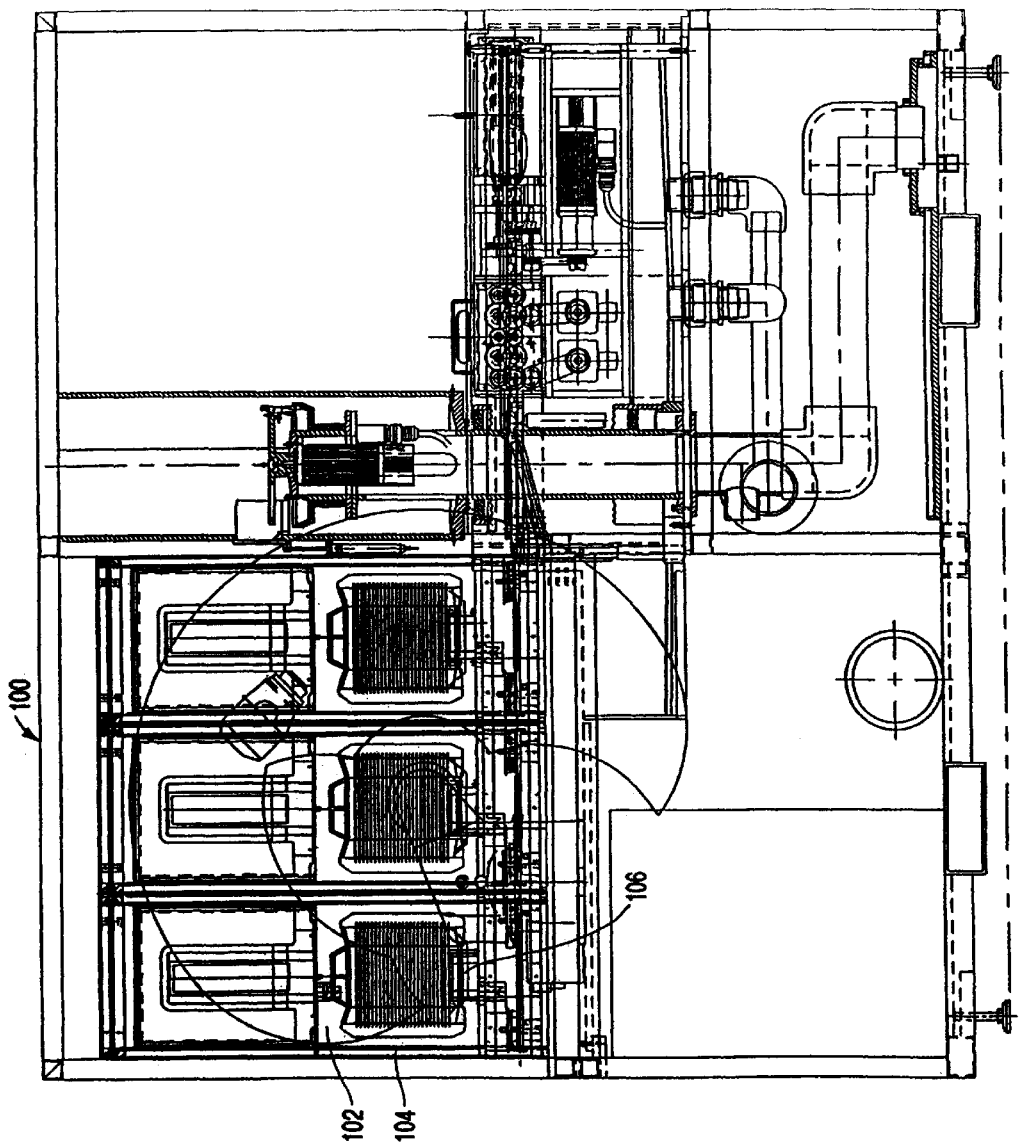
FIG. 2 is a front view of the machine of FIG. 1.
Figure 3:
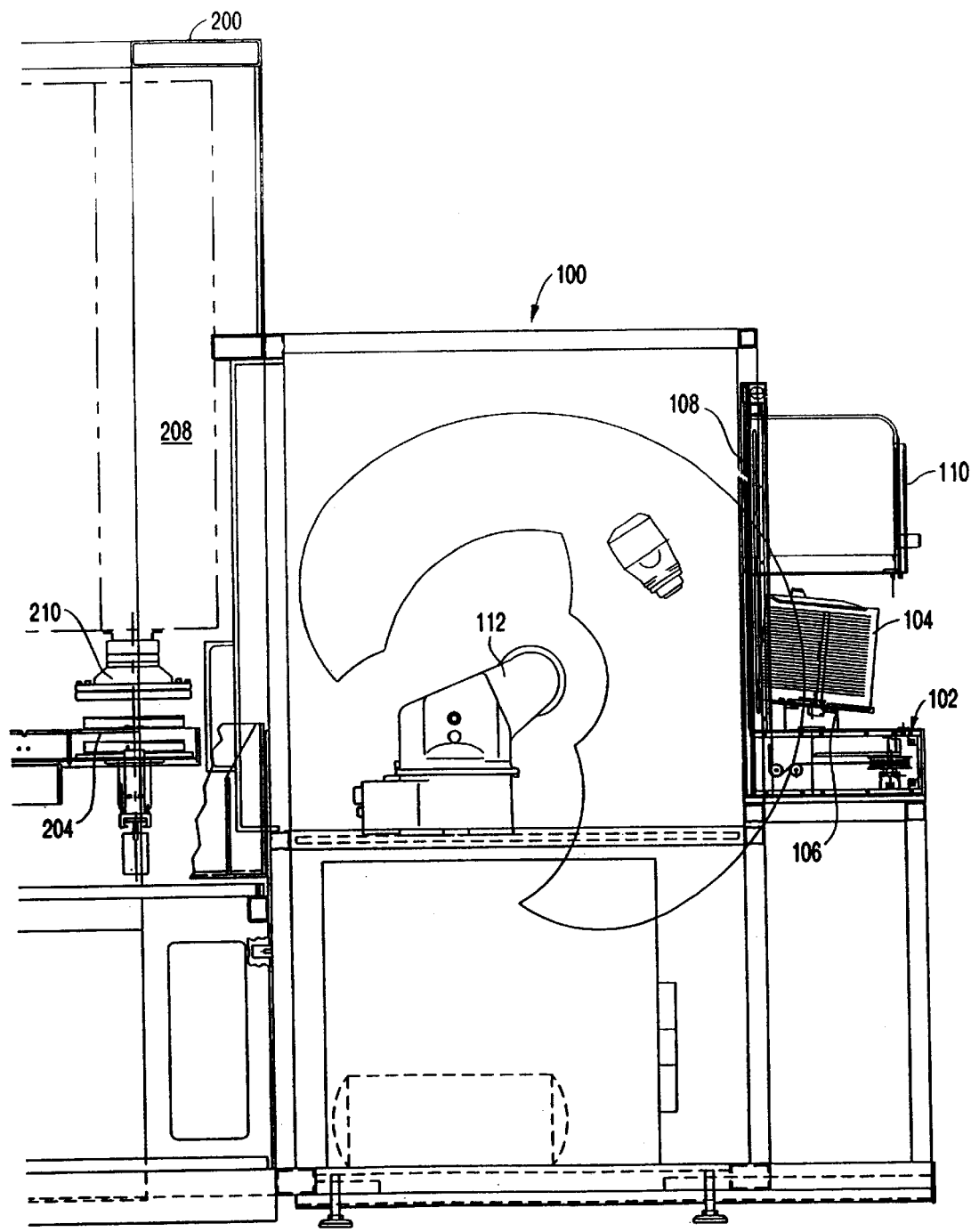
FIG. 3 is a side view of the load/unload station and a portion of the index station of the machine of FIG. 1.

With continued reference to FIG. 1 and additional reference to FIGS. 2 and 3, wafer load/unload station 100 is configured to accommodate a plurality of wafer cassettes to permit substantially continuous operation of machine 10. Preferably, load/unload station 100 includes three wafer cassette platforms 102, each configured to hold at least one wafer cassette 104 full of wafers to be polished and cleaned. In this regard, although the present invention is described in the context of exemplary workpieces such as semiconductor wafers, virtually any substantially flat, substantially circular workpiece may be employed in the context of the present invention.

Typically, three wafer cassettes 104 are loaded into the respective cassette platforms 102. Machine 10 then processes all wafers which reside in a first one of the cassettes 104. After all wafers have been removed from the first cassette 104, machine 10 processes the wafers in a next one of the cassettes 104. After the wafers have proceeded through the CMP and cleaning processes, machine 10, as discussed more fully below, preferably returns the wafers back to the same slot in the same cassette 104 from which they originated. After machine 10 has returned all wafers back to a cassette 104, that cassette may be removed from its cassette platform 102 a new cassette 104 (filled partially or fully with wafers) installed in its place. In this manner, substantially continuous, uninterrupted input of wafers into machine 10 may be achieved, facilitating substantially higher workpiece throughput than previously achievable with known CMP machines. Moreover, because machine 10 polishes, cleans, and dries the wafers in one continuous process, the need for separate cleaning machines and additional processing is alleviated. Also, because machine 10 returns the wafers back to the same slot in the same dry cassette from which they originated, the operator and the manufacturing facility can better track each cassette and each wafer through the fabrication process.

With continued reference to FIGS. 1–3, each cassette platform 102 includes a tilted base 106 for supporting each cassette 104. The tilt of base 106, and accordingly cassette 104, causes the wafers in the cassette 104 to slide to the back of each cassette, ensuring that the wafers are properly positioned in the cassette prior to removal. Similarly, as machine 10 places wafers back into the cassettes, the tilted cassette ensures that the wafers are properly secured in the cassettes prior to their removal. Base 106 preferably has a tilt in the range of 5–18 degrees, and most preferably has a tilt of 6 degrees. Base 106 may be manually set at the desired degree of tilt or, alternatively, an elevator assembly, for example a servo assembly, stepper motor, torque motor assembly, or the like, may be used to adjust the tilt of base 106.

Each cassette platform 102 preferably includes two doors for maintaining a clean room environment within load/unload station 100 and within cleaning station 400. An inner platform door or barrier 108 is located between each platform 102 and load/unload station 100 and is configured to automatically engage and retract at certain times. Similarly, an outer platform door 110 is located on the outer front side of the platform and isolates platform 102 from the outside environment. For safety reasons and to ensure that contaminants from the outside environment are prevented from entering the load/unload and cleaning stations, inner door 108 is configured to close before an operator may open outer door 110. Accordingly, outer door 110 includes a controlled locking mechanism, for example, a magnetic or pneumatic lock, which prevents an operator from opening outer door 110 until it is safe to do so.

Platforms 102 preferably comprise various sensors for monitoring cassette positions and other status information. In particular, platforms 102 include cassette position sensors for monitoring whether cassettes are properly positioned on base 106, and outer door sensors for determining whether outer door 110 is open or closed. If cassette 104 is improperly positioned on base 106, the cassette position sensor will send a signal to the machine's controller which, in turn, will sound an alarm or illuminate a warning light for the operator. Similarly, if outer door 110 is open, the outer door sensor will send a signal to the machine's controller, and the controller will prevent inner door 108 from opening, thus ensuring that the clean room portion of the machine is not compromised.

Platforms 102 also preferably comprise cassette status sensor/indicators for monitoring the status of cassettes during processing. For example, the cassette status indicator may transmit signals to the machine's processor/controller indicating that a cassette is present, that a cassette is mapped and in service, or that cassette processing is completed and the cassette is ready to be removed. Accordingly, if a cassette is in service, the processing system will lock outer door 110 and prevent the operator from removing it. Similarly, if the status indicator indicates that it is safe for the operator to access the cassette, the operator can request the processing system to unlock outer door 110 so that the operator can remove and/or replace the cassette.

Cassette platforms 102 are preferably configured to accommodate many different cassette designs and configurations. Most preferably, platforms 102 are configured to accept 6 inch, 8 inch and 300 millimeter wafer cassettes. Alternatively, load/unload station 100 could be configured to accept Standard Machine Interface (SMIF) wafer pods instead of traditional open air wafer cassettes and cassette platforms. In such a configuration, load/unload station 100 would include SMIF pod adapters in place of cassette platforms 102.

Platform areas 102 may include ionizers to minimize accumulation of static charge. Also, as one skilled in the art will appreciate, when outer door 110 is opened, particles from the outside environment may enter platforms 102. Positive laminar air flow may be provided by HEPA filters mounted above machine 10 in order to keep airborne particles out of platforms 102. Suitable filters are manufactured by Asyst Technologies, Inc. of Fremont, Calif. In addition, each platform may include a back lighting system which improves the effectiveness of the wafer mapping system which is described in more detail below.

Figure 4:
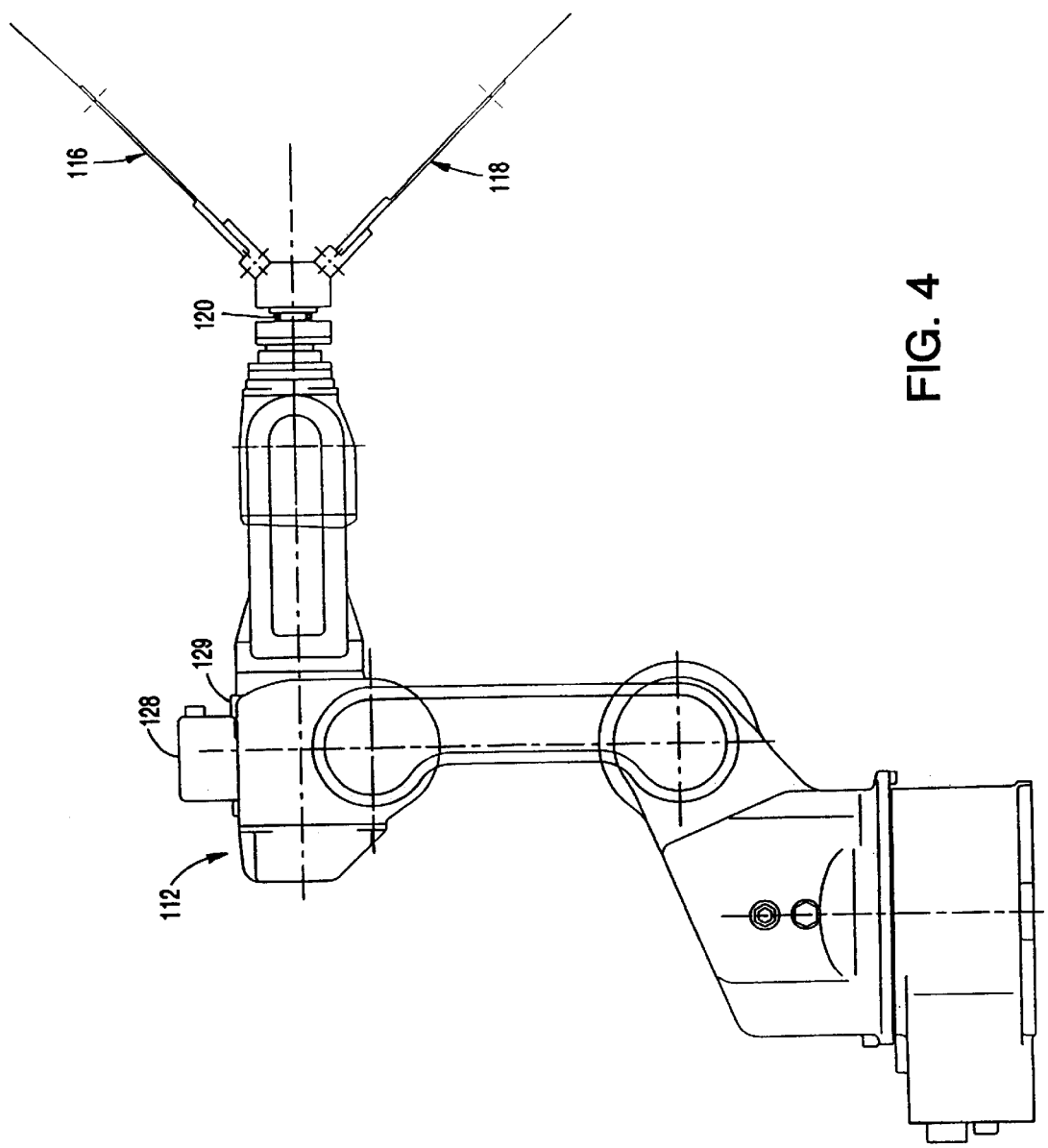
FIG. 4 is side view of a robot used in the load/unload station of the machine of FIG. 1.

After cassettes 104 are placed in platforms 102 and machine 10 is set for processing, robot 112 removes wafers individually from cassettes 104 and moves them through air knife 114 to index station 200. Referring now to FIGS. 4–6, robot 112 preferably comprises a six-axis robot, for example, the SV3 six-axis robot manufactured by Motoman, Inc. of West Carrollton, Ohio. Robot 112 preferably includes two wafer controlling end-effectors 116 and 118 connected to the wrist axis 120 of robot 112. End-effector 116 is configured to handle dry wafers (e.g., wafers in transit from a cassette to the index station and wafers in transit from the spin dryer station to a cassette), and end-effector 118 is configured to handle wet wafers (e.g., wafers in transit from the rinse station to the spin-dry station). Of course, end-effector 116 may be configured to handle wet wafers and end-effector 118 may be configured to handle dry wafers, or both end-effectors may be configured to handle all wet or all dry wafers.

End-effectors 116 and 118 include vacuum holes 122 for applying vacuum pressure to wafers held thereon. A vacuum source is configured to supply the necessary vacuum pressure. The vacuum pressure applied to the end-effectors securely holds the wafers on the end-effectors while robot 112 moves the wafers about its various axes. For example, robot 112 removes wafers from cassettes 104 "device side down". The wafers are then moved through air knife 114 and into index station 200, where they are flipped into a "device side up" state and placed on an index load cup 204 (see FIG. 1). The vacuum pressure holds wafers on the end-effector as robot 112 flips the wafer.

End-effectors 116 and 118 preferably include sensors (typically vacuum-type) for detecting the presence or absence of a wafer on the end-effector. If a wafer is lost from an end-effector during transport of the wafer, the sensor will promptly detect the error and send a signal to the robot controller and/or the machine controller to stop system processing and sound an alarm. The machine controller and associated alarm system will stop machine 10 so that other expensive wafers are not lost. In addition, end-effectors 116 and 118 may manufactured from, or coated with a static dissipative material, such as ESD410, to make them resistant to electrostatic discharge. Alternatively, load/unload station 100 and/or robot 112 may include an ionizing system to help reduce the build up of electrostatic charge.

Referring now to FIG. 4, robot 112 may include a mapping system for determining which locations within a wafer cassette contain wafers and for determining whether any of the wafers are improperly positioned within a cassette. Examples of improperly positioned wafers include multiple wafers disposed within a single slot, and wafers cross-slotted between two slots. The mapping system preferably includes an optical scanning device 128, such as a video camera, mounted in a mounting bracket 129 attached to a top portion of robot 112 so that robot 112 can scan wafer cassettes 104. As one skilled in the art will appreciate, however, the scanning device may be attached to any suitable portion of robot 112. Alternatively, the mapping system and scanning device may be installed on machine 10 completely independent from robot 112.

Mapping system 128 preferably comprises an optical vision mapping system, for example, the "IVS Express" mapping system manufactured by Acuity Imaging, Inc. of Cincinnati, Ohio, which determines the location of wafers within a cassette and transmits that information to a system processor configured to interpret and process the signals received from the scanning device. The processor incorporated in the robot controller, the machine controller, an independent mapping processor, or a combination of these devices. The processor receives vision data and converts it into wafer location data. The location data preferably comprises thirty-two bits of data: thirty bits are used to define the cassette and slot information for each wafer; one bit is used as an error bit to signify that a wafer is cross-slotted between two slots; and the other bit is used as an error bit to signify that a cassette slot contains multiple wafers. If one of the two errors occur, the processor will send a signal to the machine controller, which will stop the machine processing and notify the operator that there is a problem. If no error occurs, the controller will save the location information for each wafer and, as discussed in more detail below, will use that stored information to ensure that each wafer is placed back in the same slot in the same cassette from which it originated.

While the embodiment of the invention disclosed herein refers to a "processor" that performs the storage and machine and mapping control functions, one skilled in the art will appreciate that the processor may comprises a single processor, or alternatively, multiple linked processors. Some of the control and storage functions may be performed by the mapping or robot controllers, for example, while others are performed by the machine's controller. The distribution of control functions among multiple processors is well known in the art. Moreover, while thirty-two bits of data are preferred for defining wafer locations and/or wafer position errors, any appropriate number of bits may be used to designate wafer location information. Additionally, the wafer mapping system may be configured to perform wafer code reading (bar code or OCR) directly.

After the vision mapping system maps each cassette 104, wafer processing begins. Referring again to FIG. 1, CMP processing of wafers will now be discussed. As mentioned above, robot 112 removes wafers individually from a cassette 104 and transfers them through an air knife 114 and into index station 200. Air knife 114 preferably comprises an opening between load/unload station 100 and index station 200 and includes a positive airflow from load/unload station 100 into index station 200 to keep renegade particles from entering the clean load/unload station. As one skilled in the art will appreciate, though the present invention is described with reference to a particular air knife design, any particle control means may be used to keep particles from entering load/unload station 100 while allowing wafers to be transferred into index station 200 from load/unload station 100.

After entering index station 200, robot 112 places each wafer device side down onto one of a plurality of load cups 204 residing on index table 202. Index table 202 also includes a plurality of wafer unload cups 206 which alternate with load cups 204. After a wafer is deposited on one of the plurality of load cups 204, table 202 rotates so that a new load cup 204 aligns with air knife 114. Robot 112 then places the next wafer on the new empty load cup 204. This process continues until all load cups 204 are filled with wafers. Index table 202 preferably includes five load cups 204 and five unload cups 206.

Next, wafer carrier transport assembly 208 having individual wafer carrier elements 210 (see FIG. 3) aligns itself over index table 202, such that respective carrier elements 210 are positioned directly above the wafers residing in respective load cups 204. Transport assembly 208 then lowers carrier elements 210 into proximity with the wafers such that carriers 210 can retrieve the wafers from the load cups. After each carrier obtains a wafer, transport assembly 208 moves the carrier elements with their respective wafers laterally into CMP station 300 and positions the wafers above a polishing table 302. Once above polishing table 302, transport assembly 208 lowers carrier elements 210 such that the wafers are pressed into operative engagement with a polishing pad disposed upon polishing table 302. During polishing, polishing table 302 and the polishing pad disposed thereon rotate about their vertical axes. Simultaneously, individual carrier elements 210 spin the wafers about their respective vertical axes and oscillate the wafers back and forth across polishing table 302 as the wafers are pressed against the polishing pad. In this manner, the surfaces of the wafers are polished and/or planarized.

After an appropriate period of processing time, the wafers are lifted from the polishing pad, and transported back to index station 200. At this time, the wafers may be polished on a second polishing table 213, if desired. Next, transport assembly 208 lowers individual carrier elements 210 which deposit the wafers into unload cups 206. After a batch of polished wafers has been deposited into unload cups 206, index table 202 rotates and carrier elements 210 are again lowered to receive a new set of wafers from load cups 204 for polishing. The wafers are transported to CMP station 300 and the process repeats. While wafers are being polished in CMP station 300, robot 112 loads wafers into load cups 204, and flipper arm 212 removes wafers from unload cups 206 and transfers them to cleaning station 400. As discussed in more detail below, flipper arm 212 lifts the wafers out of index station 200 and transfers them onto a water track on cleaning station 400.

Although transport assembly 208 is described as having five polishing stations or wafer carrier elements 210, use of any appropriate number of carrier elements is envisioned. Moreover, the present invention may be employed in circumstances where not all carrier elements are functioning at the same time. Many standard wafer cassettes, for example, have slots to accommodate twenty-four individual workpieces or wafers. Consequently, with a five carrier element transport apparatus, when the last four disks within a cassette are retrieved for polishing, the fifth carrier element will be empty.

For a more detailed discussion of CMP processes, and in particular, the detailed workings of CMP machines similar to CMP station 300, see Karlsrud, et al., U.S. Pat. No. 5,329,732, issued July, 1994; Karlsrud et al., U.S. Pat. No. 5,498,196, issued March, 1996; and Karlsrud, et al, U.S. Pat. No. 5,498,199, issued March, 1996, all of which are incorporated herein by reference.

Figure 7:
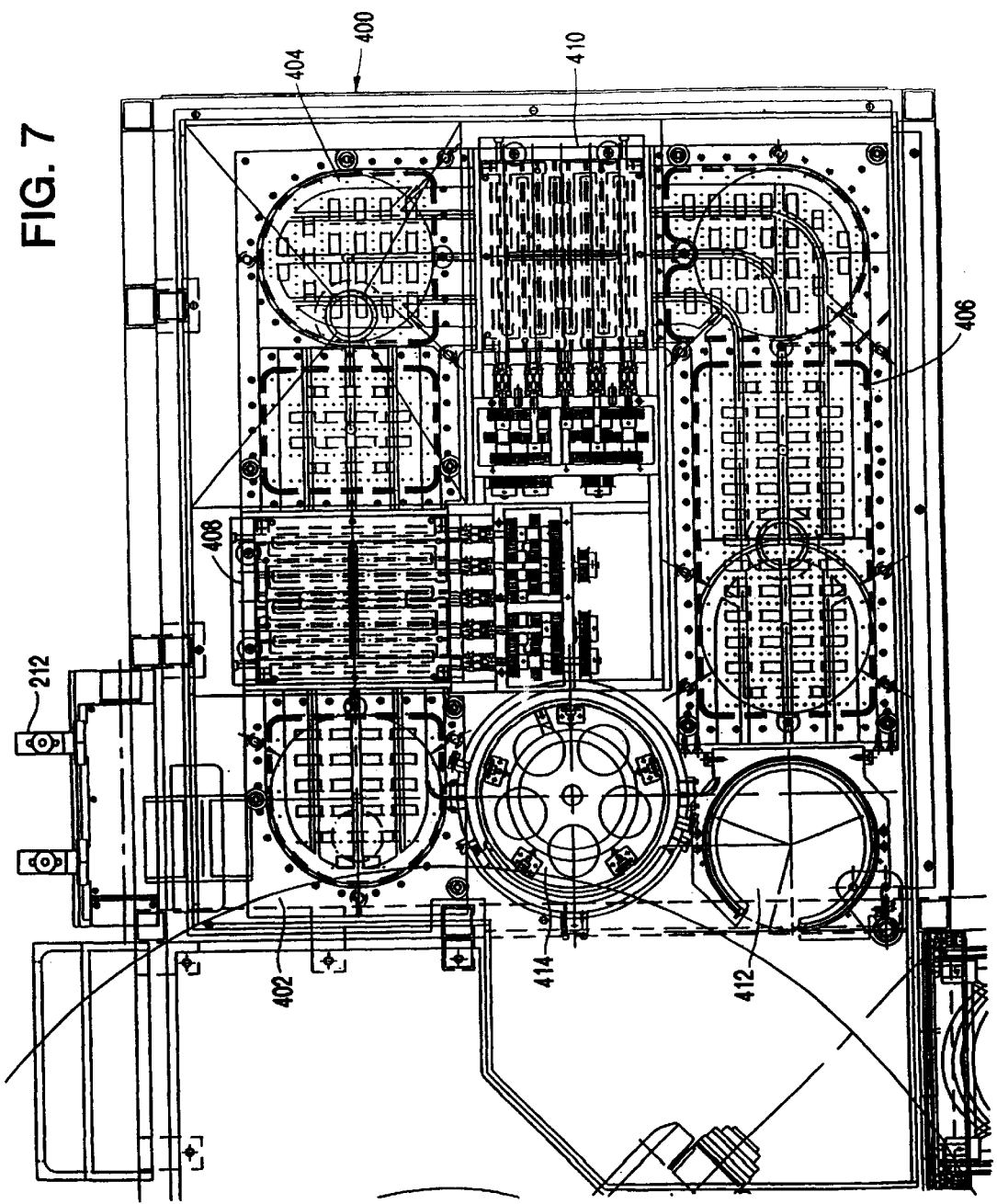
FIG. 7 is a plan view of the cleaning station of the machine of FIG. 1.

Cleaning station 400 is illustrated in detail in FIG. 7. Cleaning station 400 preferably comprises first, second and third water tracks 402, 404 and 406, first and second scrub stations 408 and 410, a rinse station 412 and a spin-dry station 414.

Figure 23:
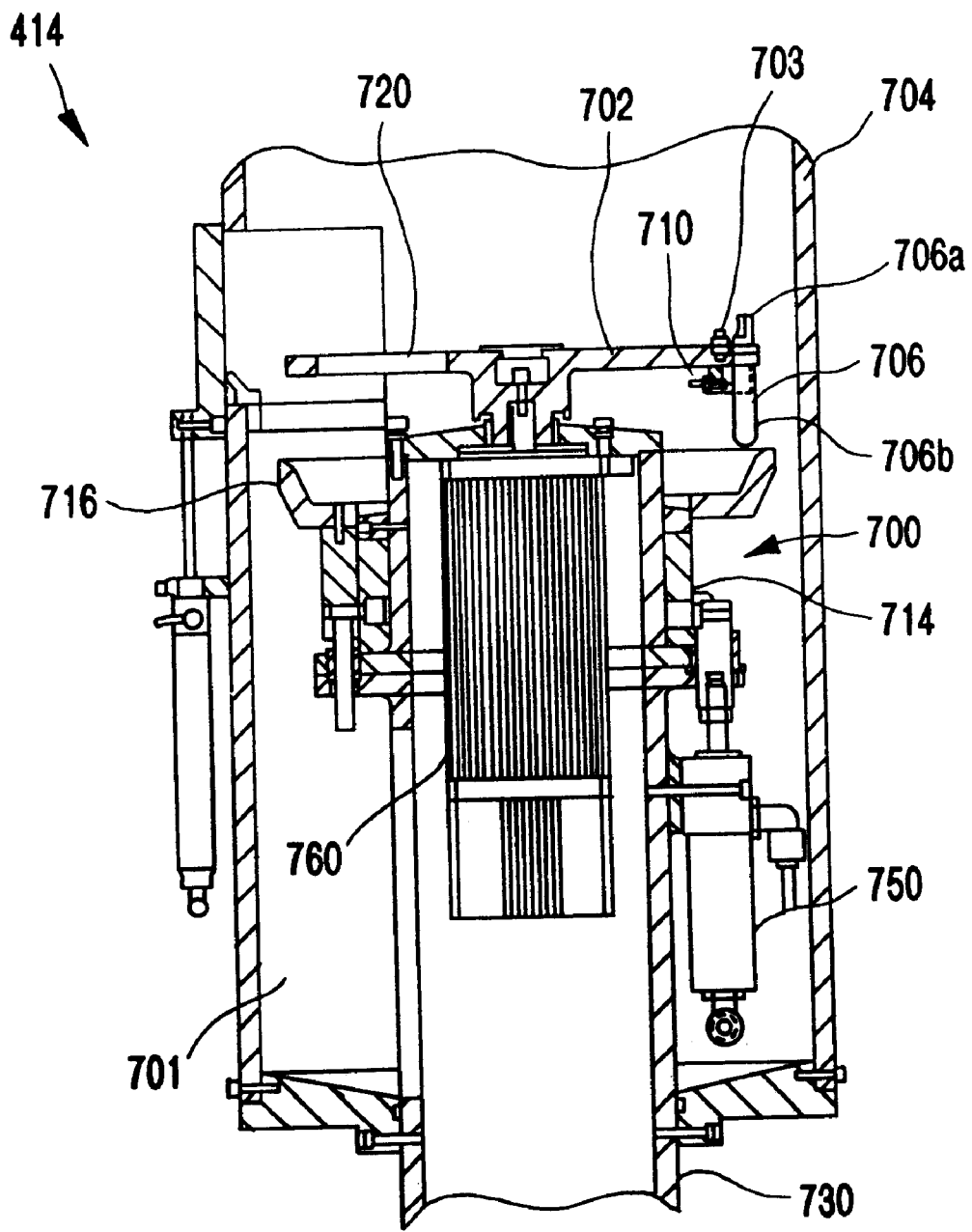
FIG. 23 is a sectional view of the spin dryer station of the machine of FIG. 1.
Figure 24:
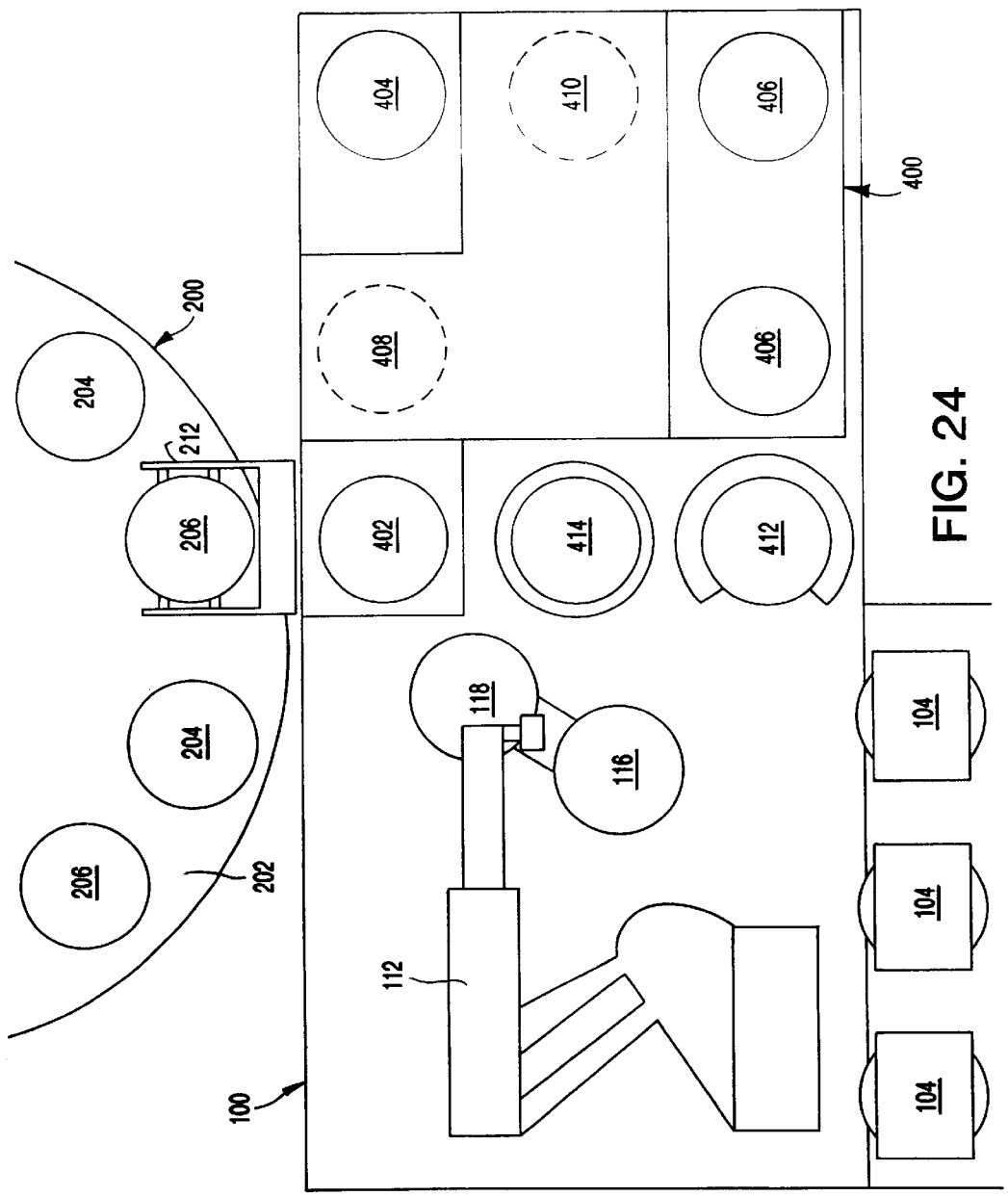
FIG. 24 is a schematic diagram showing the course of wafer flow according to the present invention.

Prior to describing the various substations of cleaning station 400 in detail, the wafer flow between index station 200, cleaning station 400 and load/unload station will be described in very general terms. FIG. 23 provides an overview of the wafer flow between these stations. Essentially, before a wafer can be moved from one station to the next, not only must processing at that station be complete, but it must also be verified that no wafers are present in the next processing station. Hence if any one of the stations in the machine breaks down or stalls, or if a wafer becomes lodged or broken, no wafers will be passed on until the problem is corrected as sensors will indicate that a wafer is present in the next station. To illustrate this important system of checks, the progress of two hypothetical wafers will be tracked: a wafer "A" that begins its journey from unload cup 206 of index table 202 and a wafer "B" that is present in the next immediate station, first water track 402.

Before wafer "A" can be moved by flipper 212 into first water track 402, the machine controller, utilizing sensors appropriately located in cleaning station 400 as will be described below, must first verify that wafer "B" has been passed from track 402 to first scrub station 408. Once this is verified, flipper 112 moves wafer "A" from unload cup 206 onto first water track 402. Wafer "A" is moved from water track 402 into scrub station 408 only when it has been verified that wafer "B" has moved onto second water track 404. Wafer "A" is retained in scrub station 408 until scrubbing is complete and until it is verified that wafer "B" has moved onto second scrub station 410, at which time "A" is moved onto second water track 404. When wafer "B" has moved from second scrub station 410 to the first portion of third water track 406, wafer "A" is passed to second scrub station 410. After wafer "B" is passed from the first to the second portion of water track 406, and scrubbing of wafer "A" in station 410 is complete, wafer "A" is passed into the first portion of track 406. After wafer "B" is passed from the second portion of track 406 into rinse station 412, wafer "A" is moved into the second portion of water track 406.

Once rinsing of wafer "B" is complete, wet end-effector 116 of robot 112 retrieves wafer "B" from rinse station 412. When this step has been verified, wafer "A" is passed into station 412 from the second portion of water track 406 for rinsing. Wafer "A" remains in station 412 until rinsing is complete and until it is verified that wafer "B" has been transferred from wet end-effector 116 into spin dryer station 414. At this time, wafer "A" is retrieved from rinse station 412 by the wet end-effector 116 of robot 112. Wafer "A" is then moved into spin dryer station 414 when it is verified that wafer "B" is present on dry end-effector 118 of robot 112. When spin drying of wafer "A" is complete and it is verified that wafer "B" has been placed in the proper slot of an unload cassette 104 by dry end-effector 118, wafer "A" is retrieved by dry end-effector 118 and placed in its proper slot in an unload cassette 104.

With this general framework of the wafer flow established, the detailed operations of each of the various substations will now be described. With reference to FIGS. 8 and 9, first water track 402 is configured to receive a wafer and hold it in a staging position until the cleaning station is ready for it to be released. When ready, first water track 402 guides the wafers in a non-contacting fashion into first scrub station 408.

Upon being received by cleaning station 400, the wafers are supported by fluid which is projected upwardly from the plane of the track through a plurality of fluid jets, as described in greater detail below, such that mechanical contact between the wafers and the water tracks is substantially eliminated.

First water track 402 preferably includes a plurality of fluid jets 416 configured to urge wafers out of the water track along the direction of arrow 418 (FIG. 8) and into first scrub station 408. More particularly, fluid jets 416 are oriented to discharge fluid upwardly at an angle with respect to the horizontal plane on the order of about 20°–70°, and most preferably about 45°, with the horizontal flow vector oriented along the direction of arrow 418. In this way, wafers received from index station 200 are urged along water track 402 into scrub station 408 without mechanical contact. Fluid is preferably supplied to individual fluid jets 416 through fluid manifold 428. Manifold 428 is located beneath the top surface of the water track and is in fluid communication with jets 416. Fluid is supplied to manifold 428 by fluid source 430. Reverse fluid jets 424 and fluid jet 426 preferably have independent fluid sources.

With continued reference to FIGS. 8 and 9, first water track 402 further comprises a detection sensor 420 disposed proximate an edge of first water track 402. Sensor 420 monitors the steady state operation of machine 10, particularly that of cleaning station 400, and may be configured to generate an alarm, or to stop machine operations in the event that a wafer is detected as being "hung up" or otherwise lodged in the vicinity of the sensor. Sensor 420 may also be employed to count wafers as they pass by (or to confirm that no wafer is present) to thereby confirm that machine 10 is operating properly. Finally, sensor 420 is preferably positioned near an edge of track 402 so that it will detect the absence of a portion of a broken wafer. If sensor 420 is positioned in the center of track 420, it might not detect broken wafers. It should be appreciated that water track 402 could utilize any appropriate number of sensors to measure throughput of wafers or for diagnostic purposes. In addition, and as discussed in more detail below, similar detection sensors may be positioned in second and third water tracks 406 and 408. Detection sensor 420 may comprise any suitable mechanism for detecting the presence and/or absence of a workpiece, such as an optical sensor or the like.

During operation, a wafer is typically held in first water track 402 until the system has determined that the subsequent stage is clear to receive the next wafer. Track 402 includes a staging pin 422 and reverse fluid nozzles 424 to help maintain the wafer within the track. Staging pin 422 comprises a mechanically or pneumatically operated pin device which extends above the top surface of water track 402 when engaged and prevents the wafer from continuing down the track. In addition, reverse fluid nozzles 424 may be used to apply fluid pressure to the wafer, also preventing it from continuing down the track. Reverse fluid nozzles 424 push the wafer back in the direction opposite arrow 418, thus minimizing contact between the wafer and pin 422 and reducing the risk of damage to the wafer. When the system has determined that it is safe for the wafer to be passed on to the next processing station, staging pin 422 lowers and fluid nozzles 424 turn off. In addition, a forward fluid nozzle 426 provides a burst or steady stream of fluid to encourage the wafer down the track in the direction indicated by arrow 418. Angled fluid jets 416 also help the wafer down the track.

FIGS. 10–14 illustrate the configuration and operation of second and third water tracks 404 and 406. When wafers exit first scrub station 408, they enter a first portion 432 of second water track 404. As a wafer enters first portion 432, fluid from fluid jets 416 engages the wafer and urges it down the track in the direction indicated by arrow 434 and into staging area 436 of second water track 404. As illustrated in FIG. 11, staging area 436 is at a slightly lower horizontal plane than first portion 432 to prevent the wafer from floating back into first portion 432. As with first water track 402, staging area 436 of second water track 404 includes a staging pin 422 and reverse fluid nozzles 424 for maintaining the wafer in the staging area until the next processing station is ready to receive it. Staging area 436 also includes a detection sensor 420 for detecting the presence of a wafer in the staging area.

After the system has determined that the next processing station, ie., second scrub station 410, is clear to receive the wafer, staging pin 422 is lowered, reverse nozzles 424 are turned off, and fluid nozzle 426 ejects fluid to urge the wafer down the water track in the direction indicated by arrow 438 and into second scrub station 410. Fluid jets 416 in second water track 404 also help urge the wafer in the direction of arrow 438. Second water track 404 also includes at least one fluid manifold 428 and fluid source 430. Preferably, second water track 404 includes two manifolds and two water sources. From second scrub station 410, the wafer enters third water track 406 from the direction indicated by arrow 438 (FIG. 13).

Referring now to FIGS. 13–14, third water track 406 comprises a first staging area 440, a transition area 442 and a second staging area 444. As with the staging areas in water tracks 402 and 404, staging areas 440 and 444 comprise fluid jets 416, detection sensors 420, staging pins 422, reverse nozzles 424 and fluid nozzles 426. Staging area 440 includes two staging pins 422: one pin prevents wafers from traveling down the water track in the direction indicated by arrow 446 and the other pin prevents wafers from floating back into second scrub station 410 (see arrow 438). Staging area 444 includes two sets of reverse fluid nozzles 424: one set prevents wafers from passing into the next processing station (i.e., rinse station 412) and one set prevents wafers from floating back up water track 406 in the direction opposite arrow 446. Transition section 442 comprises a plurality of fluid jets 416 to urge the wafer from first staging area 440 into second staging area 444. As with first and second water tracks 402 and 404, third water track 406 includes at least one fluid source 430 for providing fluid to manifold 428 and, in turn, fluid jets 416. Staging areas 440 and 444, and transition area 442, preferably have their own manifolds 428 and fluid sources 430. As with water tracks 402 and 404, reverse fluid nozzles 424 and fluid nozzle 426 preferably have independent fluid sources.

Water tracks 402, 404, and 406 further comprise means, such as wetting nozzles, for keeping wafers wet as they are staged in and/or pass down water tracks. Alternatively, fluid jets 416, reverse fluid nozzles 424 and fluid nozzles 426 may be used for this purpose.

Figure 16:
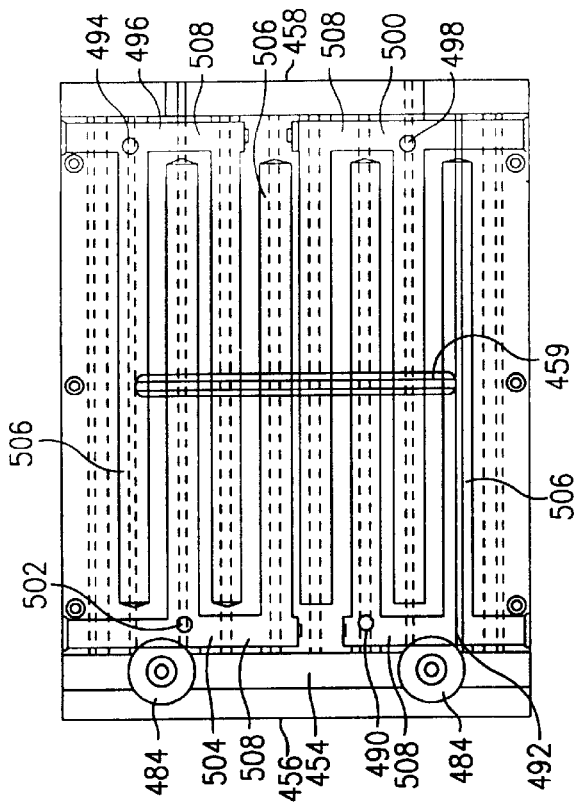
FIG. 16 is a plan view of the top panel of the scrubber box of FIG. 15.
Figure 17:
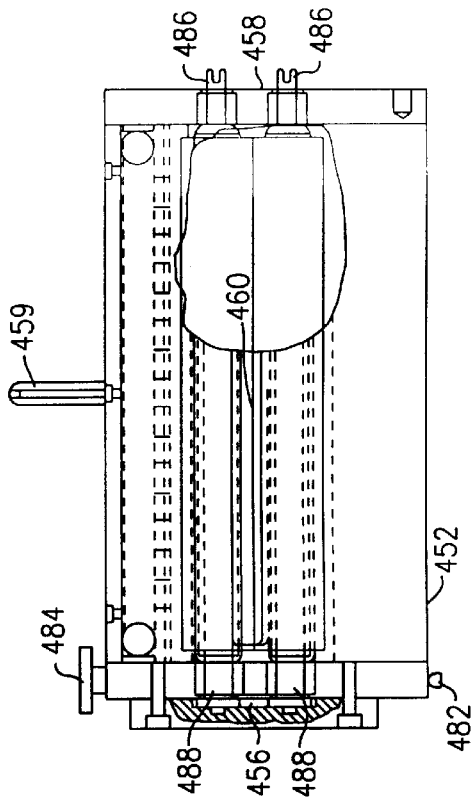
FIG. 17 is a rear view of the scrubber box of FIG. 15.
Figure 15:
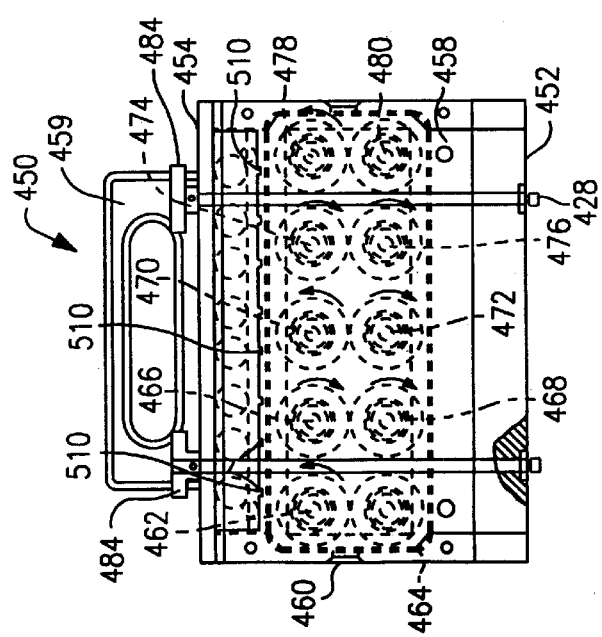
FIG. 15 is a front view of the scrubber box of the machine of FIG. 1.

Referring now to FIGS. 15–17, scrub stations 408 and 410 preferably comprise an enclosure, e.g., a scrubber box, enclosing a plurality of pairs of rollers. For sake of brevity, only one exemplary scrubber box 450 is described herein.

Scrubber box 450 comprises a bottom panel 452, a top panel 454, a rear panel 456, and a front panel 458. Hence, the panels comprise a self-contained box, which can be quickly and easily removed using handle 459 and replaced when it is desired to replace one or more of the rollers. The ability to quickly and conveniently remove and replace rollers and/or scrubber boxes in the context of the present invention further facilitates the substantially continuous operation of machine 10. Commercially available scrubber boxes such as scrubber boxes manufactured by Wacker Chemtronic company of Germany may be utilized.

Each scrubber box 450 comprises a plurality of roller pairs configured to drive wafers through the scrubber box and to simultaneously clean the top and bottom flat surfaces of wafers passing therethrough. As shown in FIG. 15, scrubber box 450 preferably includes a wafer input 460 configured to receive wafers into the enclosure. When a wafer enters the enclosure, the first pair of drive rollers (described below) "grabs" the wafer and feeds it forward to the next pair of rollers.

Scrubber box 450 has three to twelve pairs of rollers, and preferably five pairs of rollers. In the illustrated embodiment, the scrubber box includes a first roller pair comprising respective rollers 462 and 464; a second roller pair comprising upper roller 466 and lower roller 468; a third roller pair comprising upper roller 470 and lower roller 472; a fourth pair comprising upper roller 474 and lower roller 476; and a fifth terminal roller pair comprising upper roller 478 and lower roller 480. As best viewed in FIG. 15, cleaning station 400 is configured such that wafers enter scrubber boxes 450 from the far left, are sequentially urged through the box, and are discharged from the scrubber box at the far right position (proximate rollers 478 and 480).

Each of the odd pairs of rollers (e.g., the first, third, fifth roller pairs) preferably functions as a drive roller, with each drive roller pair operating at a drive speed S1. As such, rollers 462, 464, 470, 472, 478, and 480 operate at drive speed S1. The bottom rollers (i.e., rollers 464, 468, 472, 476 and 480) rotate clockwise as shown in FIG. 15. In addition, the top roller of each even roller pair (ie., rollers 466 and 474) also rotates clockwise from the perspective shown in FIG. 15. Finally, the top roller in each odd roller pair (i.e., rollers 462, 470, and 478) preferably rotates counterclockwise.

The even bottom rollers (i.e., rollers 468 and 476) are preferably configured to operate at a second drive speed S2, and the even top rollers (i.e., rollers 466 and 474) are configured to operate at a process speed S3. The tension between the rollers of each roller pair is approximately uniform throughout the roller box.

Each odd roller pair is preferably driven by a first drive motor so that the wafers are driven through the cleaning station at an essentially uniform rate. Every even top roller is preferably driven by a second motor at process speed S3; and every even bottom roller is preferably driven by the second motor at second drive speed S2 at a predetermined gear ratio below process speed S3. In this way, the operator may control the drive speed S1 by setting a first control associated with the first motor and may also independently control drive speed S3 by manipulating a second control associated with the second motor. By so doing, the operator also indirectly controls drive speed S2, as drive speed S2 follows drive speed S3 in accordance with the predetermined gear ratio discussed above. By allowing the operator to dynamically configure respective drive speeds S1, S2, and S3, substantial processing flexibility is achieved in scrub stations 408, 410. Moreover, by setting S3 higher than S1, the even roller pairs effectively clean the top and bottom surfaces of the wafers as the wafers are simultaneously moved through the scrubber box at drive speed S1 by the drive rollers (e.g., the odd roller pairs).

Although the aforementioned roller speeds reflect the best mode of practicing the invention known to the inventors at the time this application was filed, it is to be understood that virtually any number of rollers and any combination of roller speeds and roller directions may be employed in the context of the present invention. For example, two, three, or even more roller speeds may be employed, with various permutations and combinations of speed and direction being selected to achieve optimum cleaning performance for a desired application. In addition, the rotation of the brushes may be reversible to assist with wafer staging that is, the reverse rotation of the brushes can be used to maintain the wafer in the scrubber box until the next station, i.e., the wafer track, is available to receive the wafer.

With continued reference to FIGS. 15–17, scrubber boxes 450 are configured for easy installation into and removal from scrub stations 408 and 410. Bottom panel 452 includes one or more fastener assemblies 482 to permit locking engagement of scrubber boxes 450 with machine 10, and in particular, with scrub stations 408 and 410. Machine 10 may comprise, for example, a frame portion having corresponding locking holes (not shown) configured to receive fastener assemblies 482 for convenient engagement and alignment of scrubber boxes 450 with respect to machine 10. Fastener assembly 482 may comprise a screw, bolt, quick release, or any other suitable fastening mechanism for securably but releasably engaging scrubber box 450 to the frame of machine 10. Preferably, fastener assemblies 482 are quick release pins and are suitably connected to pin release handles 482 for easy engagement and/or disengagement of the pins with the frame. Bottom panel 452 may further comprise a fluid outlet (not shown) through which cleaning fluid may flow out of scrubber box 450, as described in greater detail below. If desired, the fluid retrieved from the fluid outlet may be recycled.

Referring now to FIG. 17, each of respective drive rollers 462–480 comprises a gear end 486 and a follower end 488. Each of the respective gear ends 486 are configured to extend through front panel 458. Each respective follower end 488 is configured for rotating receipt within respective follower junctions configured in rear panel 456.

Scrubber boxes 450 may be conveniently removed and replaced as follows. Machine 10 is placed in an off or hold mode of operation to permit removal and replacement of one or more of scrubber boxes 450. In this condition, fastener assemblies 482 are disengaged and scrubber box 450 is manually removed by pulling it out of scrub station 408 or 410 using handle 459. Gear ends 486 of the rollers are passively disengaged from the drive mechanism (not shown) associated with machine 10 as scrubber box 450 is removed. Once scrubber box 450 is removed, a replacement box prepared by the operator in advance may be inserted in place of the removed box. Alternatively, scrubber box 450 may be opened and the rollers quickly replaced so that the refurbished cleaning station may be returned to machine 10. In either case, scrubber box 450 is reassembled onto machine 10 by aligning fastener assemblies 482 with corresponding holes or grooves associated with the machine, and sliding box 450 back into its original operating position. Fastener assemblies 482 facilitate the alignment of gear ends 486 with the mating drive mechanism (not shown for clarity) associated with machine 10. When scrubber box 450 is reassembled into its operating position, fastener assemblies 482 may be reengaged by the operator to secure the scrubber box 450 in place. Of course, any fluid inlet, fluid discharge, or wafer sensing hardware associated with scrubber box 450 may also have to be attended to during removal and reinstallation.

Referring now to FIGS. 15 and 16, top panel 454 further comprises one or more fluid inlet ports configured to distribute fluid to a discrete portion of, or to the entirety of, the inside of scrubber box 450. Top panel 454 preferably includes a number of manifolds arranged to deliver fluid to specific locations within the scrubber box. In particular, panel 454 comprises a first fluid inlet port 490 that communicates with a first manifold 492 configured to distribute a first fluid proximate a number of rollers within the roller box. First manifold 492 is preferably disposed to release fluid substantially evenly along the length of one or more of the top rollers. Top panel 454 further comprises a second fluid inlet port 494 similarly configured in communication with a second manifold 496 for distributing a second fluid throughout a different portion of the roller box, for example, in the region occupied by the first several roller pairs. Top panel 454 further comprises a third fluid inlet port 498 in communication with a third manifold 500 configured to distribute a third fluid throughout a third region of the roller box, for example, a region proximate the last several roller pairs. Top panel 454 may also include a fourth fluid inlet port 502 that communicates with a fourth manifold 504.

Each individual manifold is configured such that it is fluidly distinct from each of the remaining manifolds. However, one or more of the fluid inlet ports may be coupled together such that a single fluid may be applied to more than one manifold. In the exemplary embodiment shown in FIG. 16, the manifolds are configured to distribute cleaning fluid to locations above and/or between adjacent rollers (the rollers are depicted in phantom lines in FIG. 16). This arrangement permits the cleaning fluid to reach wafers as they pass through the scrubber box.

Each individual manifold preferably includes a plurality of extending channels 506. Channels 506 associated with opposing manifolds, e.g., first manifold 492 and third manifold 500, may be arranged in an alternating configuration. Of course, it is to be appreciated that any number of fluid inlet ports and/or fluid manifolds may be employed in conjunction with scrubber box 450, and that the manifolds may communicate with any desired portion of scrubber box 450 with or without overlap, to optimize particular processing applications.

Top panel 454 is preferably manufactured as a one-piece, substantially seamless assembly. The seamless construction enables manifolds 492, 496, 500, and 504 to be pressurized without leaking cleaning fluid, water, or chemicals to the external portion of scrubber box 450. In one exemplary construction, manifolds 492, 496, 500, and 504 are formed by drilling or boring into a solid piece of plexiglass or other rigid material. Channels 506 (oriented horizontally in FIG. 16) are formed such that adjacent channels originate at opposite sides of top panel 454. Thereafter, several channels that originate from a common side are "connected" together by an intersecting channel 508 (oriented vertically in FIG. 16). Plugs may be employed to seal the entry holes formed during the boring or drilling process.

In addition, scrubber boxes 450 may include a fluid nozzle (not shown) at the location where wafers exit the scrubber boxes to give the wafers a good rinse or flush as they exit the roller box. In accordance with this aspect of the invention, the post scrub station rinse ensures that loosened particles do not settle back on the wafer surface as the wafer exits box 450. Alternatively, instead of using a spray nozzle on scrubber box 450, the post scrub station rinse may be accomplished by increasing fluid flow in the wafer track at the location the wafer enters the track. In this manner, the existing wafer track configuration may be utilized, thus, eliminating the need for an extra fluid nozzle or scrubber boxes 450.

If desired, cleaning station 400 may further comprise a hydrofluoric (HF) acid polish station located between second scrub station 410 and rinse station 412 (not shown). The HF station may include a robot or other handling device for dipping the wafer into the HF acid. From the HF station the wafer would travel to rinse station 412 via water track 406.

Referring now to FIGS. 18–21, the construction and operation of rinse station 412 will now be described. As wafers come out of second staging area 444 of third water track 406, they are received by rinse station 412. The air gap between third water track 406 and rinse station 412 is relatively small to ensure that wafers do not appreciably dry prior to the rinsing process. Generally, rinse station 412 is configured to receive wafers in a serial manner, thoroughly rinse each wafer with one or more rinsing solutions such as deionized water, and hold each rinsed wafer for retrieval by robot 112, which thereafter transports the rinsed wafer to spin dryer station 414 (see FIG. 7). More particularly, rinse station 412 comprises a rinse ring 600 which preferably includes a ring body 602 for holding wafers during the rinsing process. Ring body 602 comprises a fluid manifold 604 communicating with respective fluid supply ports 606A and 606B. Manifold 604 is advantageously configured with a plurality of jets 608 disposed about a substantially horizontal surface 610 of ring body 602. Fluid supply ports 606 supply fluid to the internal region of manifold 604, such that fluid is ejected from respective jets 608 at a substantially uniform pressure and flows about the arc defined by surface 610. The orientation of the fluid supply ports 606, manifold 604 and jets 608 is best seen in FIG. 18b.

Figure 21:
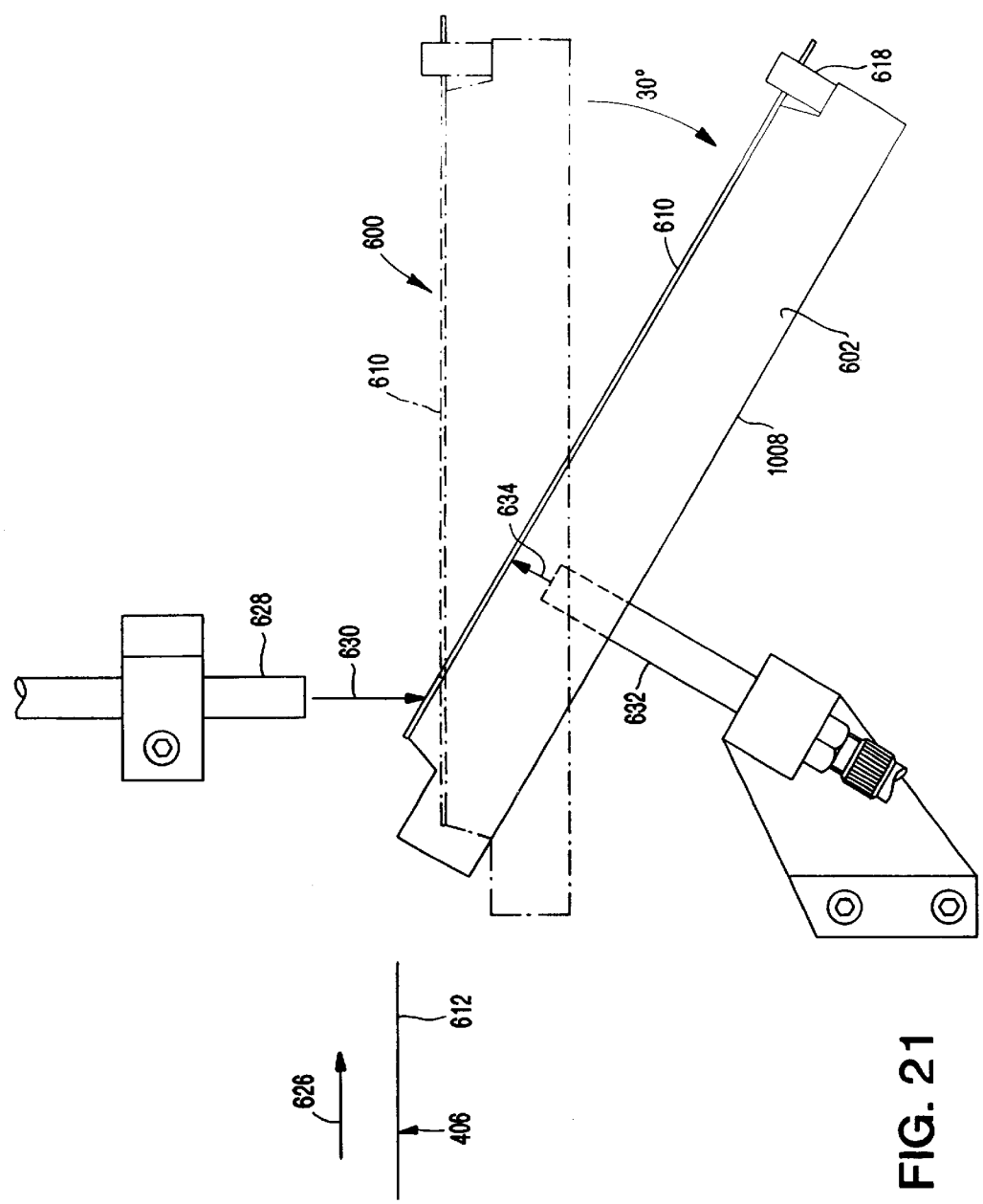
FIG. 21 is a side view of the rinse station of FIG. 18 in a declined position.

With particular reference to FIGS. 20 and 21, as a wafer is discharged from third water track 406, the plane of travel of the wafer is substantially defined by plane 612. As best seen in FIG. 21, plane 612 is slightly above (e.g., 5–20 mm and preferably about 10 mm) the horizontal surface defined by surface 610 of ring body 602. The fluid (not shown) ejected from jets 608 supports the wafer as it is transferred from the water track to the rinse ring.

Figure 18A:
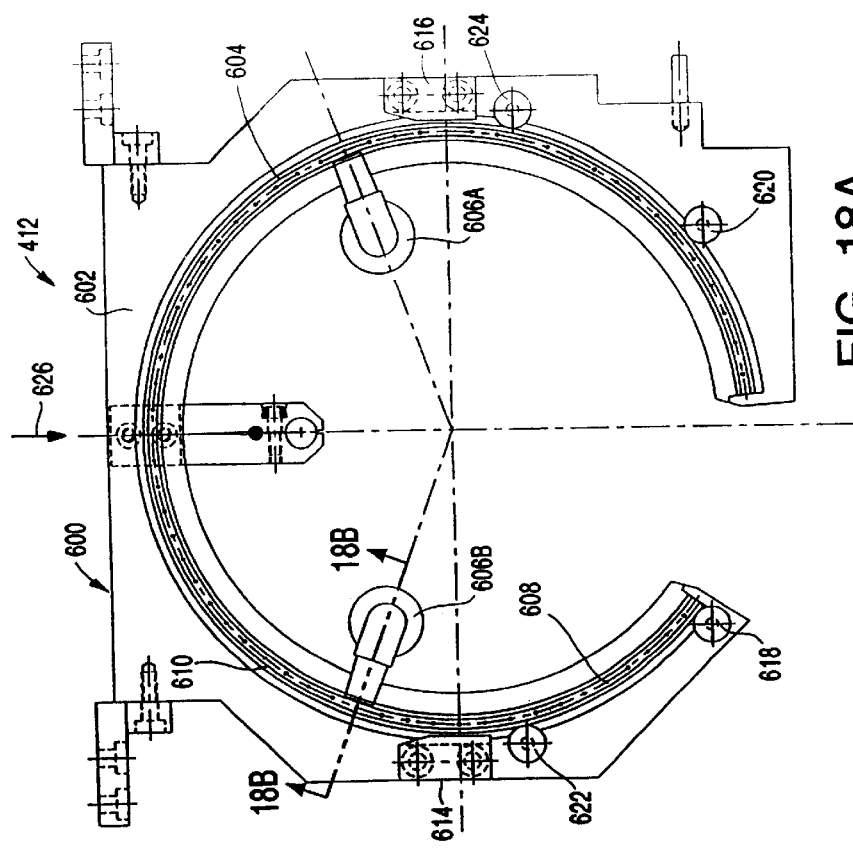
FIG. 18a is a plan view of the rinse station of the machine of FIG. 1.
Figure 18B:
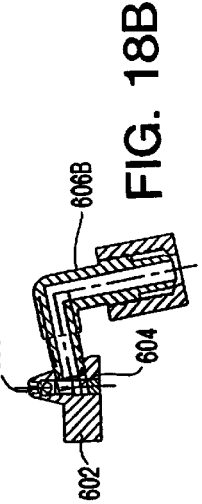
Figure 19:
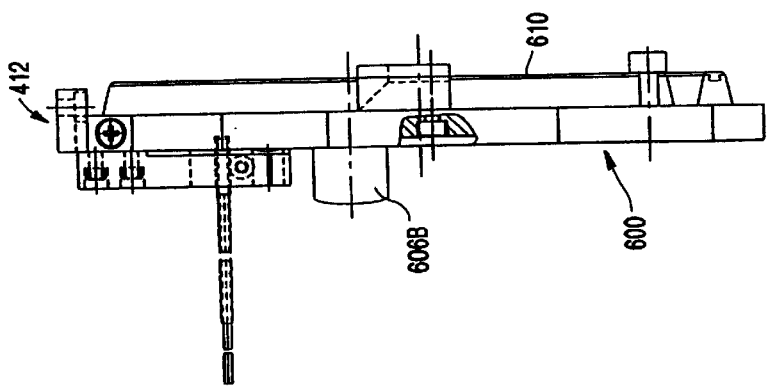
FIG. 19 is a side view of the rinse station of FIG. 18.

Referring now to FIG. 18a, wafers are preferably centered about manifold 604 through the interaction of respective wafer guides 614, 616 and respective centering pins 618, 620, 622 and 624 as they are transferred from third water track 406 to the rinse ring in the direction of arrow 626. Although the perimeter edge of each workpiece may gently contact wafer guides 614, 616 and/or one or more centering pins 618–624, mechanical contact between flat wafer surfaces and rinse ring body 602 is substantially avoided.

When a wafer is substantially centered within the rinse ring and supported by fluid ejected from jets 608 (FIG. 18), the wafer is said to be completely transferred from third water track 406 and received within the rinse station. At that point, rinse ring 600 is caused to tilt downwardly as shown in FIG. 21, deviating from the horizontal plane by an angle in the range of 10°–50°, and most preferably about 30°. In this position, preferably a laminar flow of rinsing fluid is supplied to both the upper surface and bottom surface of the wafer. More particularly, a first fluid nozzle 628 is configured to discharge rinse fluid at the upper surface of the wafer, substantially in the direction of arrow 630. A second rinse nozzle 632 is suitably configured to discharge rinse fluid at the bottom surface of the wafer, substantially in the direction of arrow 634. While rinse station 412 has been described herein as having a tiltable rinse ring, one should appreciate that the rinse ring may be fixed at an angle of about 10–50, and most preferably about 30 from the horizontal position.

Throughput may be increased by simultaneously rinsing both the upper and lower surfaces of each wafer. Moreover, by orienting upper surface rinse fluid supply port 628 with respect to the upper surface of the workpiece as shown in FIG. 21, the perimeter edge of the workpiece may also be effectively rinsed. In a preferred embodiment, rinse fluid is applied to the top surface at a rate in the range of 0.1–20 liters/minute, and most preferably at a rate of about 4–5 liters/minute. Similarly, rinse fluid is advantageously applied to the bottom surface at a rate in the range of 0.1–10 liters/minute, and most preferably at a rate of about 1.5 liters/minute.

Upon completion of the rinsing operation, the tilted rinse ring assembly is manipulated back to the horizontal position and robot 112 retrieves rinsed wafers and transfers them to spin dryer station 414. As is particularly depicted in FIG. 20b, wet end-effector 118 of robot 112 enters rinse station 412 to retrieve a rinsed wafer and transfer it to spin dryer station 414. Alternatively, robot 112 may retrieve rinsed wafers from the rinse ring while the rinse ring is in the tilted position.

Spin dryer station 414 is illustrated in FIG. 23. A spin dryer assembly suitable for use in spin dryer station 414 is fully disclosed and explained in detail in U.S. Pat. application Ser. No. 08/927,661 which was filed on even date herewith, is of common assignee, and which is incorporated herein by reference. Hence, for sake of brevity, the operation of spin dryer station 414 will be described only briefly below.

Spin dryer station 414 includes a spin dryer 700 enclosed within a chamber 701 defined by a shroud or shield 704. Spin dryer 700 comprises a workpiece platform 702 configured to hold a wafer securely thereon as the platform is spun at high velocities by motor 760. Preferably, a plurality of mass-reducing apertures are formed through platform 702 in order to reduce the mass of spin dryer 700 and thereby minimize spin cycle acceleration and deceleration times.

A plurality of gripping fingers 706 are pivotally mounted around the outer periphery of platform 702 to grasp or grip the edges of a wafer placed on platform 702 by robot 112 (wet end-effector 118). Fingers 706 include a head portion 706a which extends above platform 702 and engages the wafer, and a shank portion 706b which extends below platform 702. Gripping fingers 706, or at least the portions 706a which contact the wafers, are made of a soft, pliable material, such as Ertalyte, that will not damage or scratch the held wafers. Spring-loaded plungers 710 mounted below platform 702 contact bias shank portions 706b radially outwardly, thereby moving head portions 706a radially inwardly, to maintain gripping fingers 706 in a gripping or secured position. Wafers loaded onto spin dryer 700 do not rest directly on platform 702 but instead rest on support pins 703, which are also made of a soft, pliable material.

Actuator assembly 714 mounted below platform 702 serves to spread the gripping fingers apart and release held wafers as follows. Assembly 714 is vertically movable by virtue of its attachment to an air cylinder 750. When actuator assembly 714 is moved upwards, cam ring 716 which forms a part of assembly 714 contacts shank portions 706b of gripping fingers 706. As the shank portions slide along the cam surface of cam ring 716, they are forced to pivot radially inwardly which, in turn, causes head portions 706a to pivot radially outwardly to release a wafer or to provide clearance for a wafer to be loaded.

Hence, after wet end-effector 118 of robot 112 has retrieved a rinsed wafer from rinse station 412, it transfers the wafer onto platform 702 of spin dryer 700. Gripping fingers 706 are held in an open position by actuator assembly 714 until the wafer has been loaded and properly positioned. After end-effector 118 moves away, actuator assembly 714 lowers out of contact with shank portions 706b, and plungers 710 again bias gripping fingers 706 towards a closed position to secure the wafer for spin drying. Platform 702 is accelerated by motor 760 to a velocity of approximately 4,000 rpm in preferably about 1.0 seconds, is spun at that speed for preferably about 20 seconds to remove all water and other particulates from the wafer surfaces, and is then decelerated back to an idle condition in preferably about 1.0 seconds.

During spinning, the centrifugal forces applied to the wafer held on platform 702 draws water droplets radially outwardly and off of the wafer surfaces. To augment this drying process, an air flow module may be mounted above shield 704 to direct a column of forced air across the upper wafer surface.

Once spin drying is complete, actuator assembly 714 is again moved upwardly to engage shank portions 706b and cause gripping fingers 706 to move to a release position as described above. Assembly 714 is maintained in this position until the dried wafer has been retrieved by dry endeffector 116 of robot 112 and cleared out of spin dryer station 414. Robot 112 then returns the dried wafer to the slot of the cassette from which the wafer originated.

During operation of machine 10 various fluids need to be supplied to the CMP station, the rinse station, the water track, and to the scrubber boxes of the cleaning station. Moreover, a plurality of different fluids (e.g., three) may need to be supplied to the scrubber box during the cleaning operation. Machine 10 is preferably configured such that a desired volume rate of flow is supplied to these various operations, which flow rate is substantially unaffected by changes in fluid supply pressure, as described below.

Figure 22:
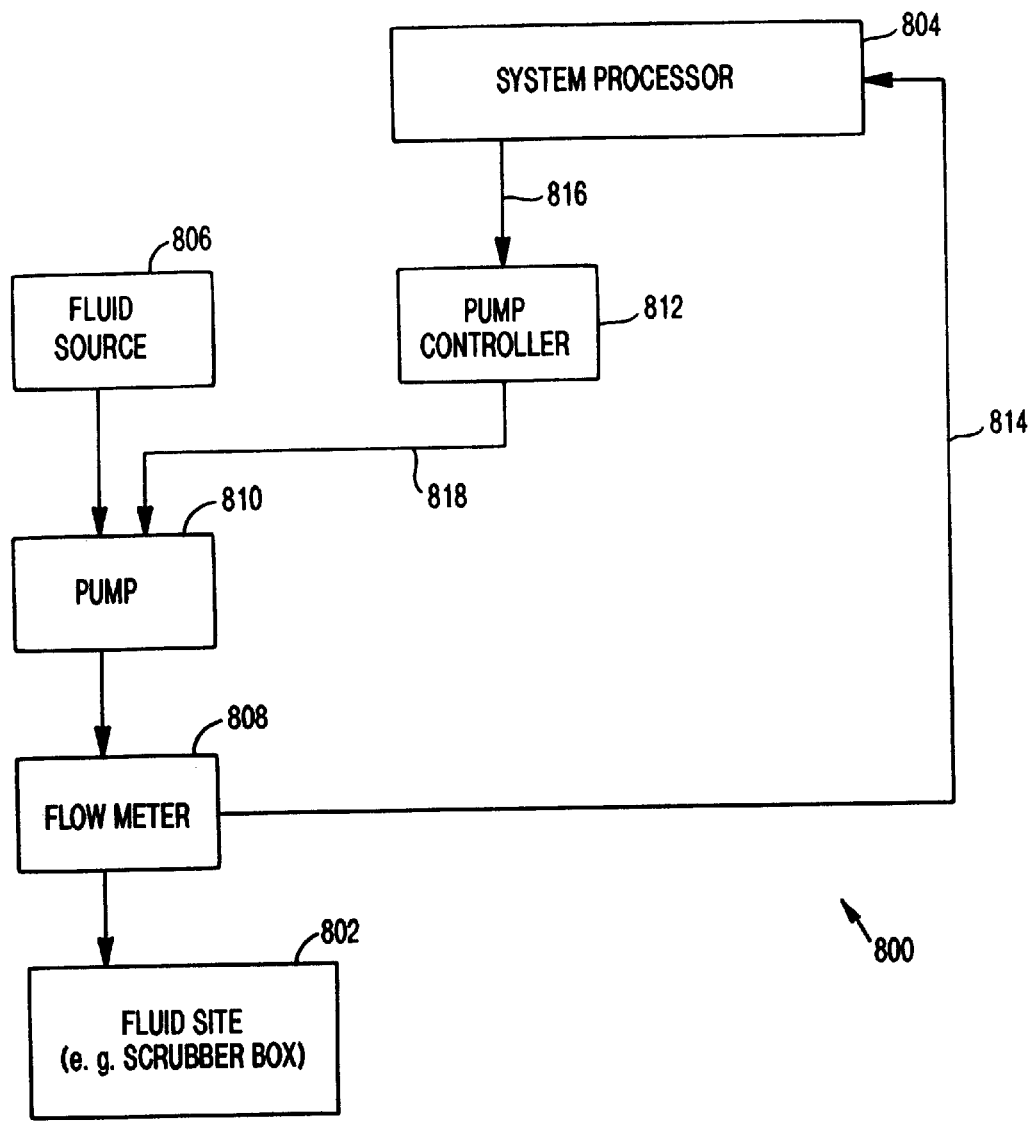
FIG. 22 is a block diagram of a fluid flow control system used in conjunction with the machine of FIG. 1.

Referring now to FIG. 22, an exemplary fluid control scheme 800 is illustrated. The box designated as a "fluid site" 802 may comprise rinse station 412, a fluid inlet port in scrubber box 450, or a wafer rinse supply port Through operation of a process controller (or one of several process controllers) 804 associated with machine 10, the volume rate of fluid flow to the fluid site 802 may be accurately controlled notwithstanding the presence of variations in the fluid supply pressure.

Control scheme 800 further comprises a fluid source 806 for holding a supply of a desired processing fluid, a flow meter 808, a pump 810 for controlling the fluid flow, a pump controller 812 for providing a pump control signal to pump 810, and a processor 804. In accordance with one embodiment of the present invention, a suitable pump may comprise peristaltic pump model number 07015-21 manufactured by the MasterFlex company of Vernon Hills, Ill. Pump controller 812 may comprise any suitable pump controller compatible with the pump being used. Alternatively, pump controller 812 may be eliminated and system processor 804 may function as the pump controller. Flow meter 808 is preferably a non-contacting flow meter such as product model number M-10000 which is available from the Malema company of San Ramon, Calif.

A desired flow rate through flow meter 808 to fluid site 802 is programmed into processor 804 prior to (or during) operation of machine 10. During operation, flow meter 808 outputs an electrical signal 814 indicative of the actual flow rate through flow meter 808 to site 802. Processor 804 receives electrical signal 814 and, responding thereto, directs pump controller 812 to adjust the pump 810 as necessary to maintain the actual flow rate within a predetermined range from the desired set point flow rate.

More particularly, if the actual flow rate from flow meter 808, as indicated by signal 814, deviates from the set point by more than a predetermined error band, processor 804 outputs an electrical signal 816 to pump controller 812. Pump controller 812 then sends a signal 818 to pump 810, directing the pump to thereby change the pumping rate in an amount necessary to drive the error between the actual flow rate and the desired flow rate through flow meter 808 to a minimum. Preferably, a real time, closed loop PID control scheme is employed by processor 804 to effect this function.

For a discussion of exemplary fluid flow control systems, which may be used in this invention, see U.S. patent application Ser. No. 08/720,744, filed Oct. 2, 1996 and entitled "Methods and Apparatus For Measuring and Dispensing Processing Solution to a CMP Machine", and U. S. Provisional Patant Application No. 60/054,764 filed Aug. 5, 1997 and entitled "Closed Loop Flow Control System for Post-CMP Cleaners", both of which are of common assignee and are incorporated herein by reference.

Load/unload station 100 and cleaning station 400 are preferably maintained in a class 1–10 clean room environment. Hence, the housing of load/unload station 100 and cleaning station 400 should include air tight seals, and positive airflow from load/unload station 100 and cleaning station 400 into index station 200 should be utilized to keep contaminating particles that exist in index and CMP stations 200, 300 from entering the clean room environment.

A touch screen display (not shown) may be employed to allow the operator to monitor, reconfigure, troubleshoot, and otherwise operate machine 10. More particularly, a touch screen display panel may be configured to display, preferably in three dimensions, a graphical representation of the various operational features of machine 10 described above. For example, if the operator desires to load a new cassette into load station 100, the operator may press a graphical icon representative of load station 100 on the touch screen display. The touch screen display may then prompt the operator with questions, or may simply permit the operator to touch the door associated with the cassette loading function to thereby open the door. This model of touch screen interaction may be applied to virtually any aspect of machine 10 described herein.

Instead of utilizing sensors 420 in the water tracks and various processing stations, a vision system could be utilized to track wafers as they travel through cleaning station 400 and to detect when and if errors, delays, wafer breakage, or the like occur during the cleaning process. As with the vision system for mapping the locations of the wafers in the cassettes, the IVS Express vision system from Acuity Imaging Inc. could be utilized to this end.

Although the present invention has been described in conjunction with particular embodiments illustrated in the appended drawing figures, it will be appreciated that the invention is not so limited. Modification may be made in the design and implementation of the subject polishing, cleaning, rinsing and drying system without departing from the spirit and scope of the subject invention as set forth in the claims below.

We claim:

1. An integral machine for polishing, cleaning, rinsing and drying workpieces comprising:
    a load/unload station having a plurality of platforms for receiving cassettes of workpieces to be polished, cleaned, rinsed and dried;
    first transfer means for retrieving said workpieces from said cassettes;
    an index station for receiving unpolished workpieces from said first transfer means and for holding polished workpieces prior to further processing;
    a polishing station for polishing unpolished workpieces;
    second transfer means for transferring unpolished workpieces from said index station to said polishing station, and for transferring polished workpieces to said index station;
    a cleaning station for cleaning, rinsing and drying polished workpieces;
    third transfer means for transferring polished workpieces from said index station to said cleaning station; and
    fourth transfer means for transferring cleaned, rinsed and dried workpieces from said cleaning station back to said cassettes.

2. A machine as claimed in claim 1, wherein said first and fourth transfer means are incorporated into one robot.

3. A machine as claimed in claim 2, wherein said first transfer means comprises a dry end-effector.

4. A machine as claimed in claim 1, wherein said index station comprises an index table having load cups for holding said unpolished wafers and unload cups for holding said polished wafers.

5. A machine as claimed in claim 4, wherein said second transfer means comprises a movable apparatus having carrier elements which retrieve said unpolished wafers from said load cups; press said unpolished wafers against a polishing pad in said polishing station; and return said polished wafers to said unload cups.

6. A machine as claimed in claim 5, wherein said third transfer means comprises a flipper which moves said polished wafers from said unload cups of said index table to said cleaning station.

7. A machine as claimed in claim 1, wherein said cleaning station comprises a plurality of scrub stations, a rinsing station and a drying station.

8. A machine as claimed in claim 7, wherein said wafers are moved between said scrub stations and said rinsing station along a plurality of water tracks.

9. A machine as claimed in claim 8, wherein said first and fourth transfer means are incorporated into a dry end-effector of a robot, and said wafers are moved from said rinsing station to said drying station by a wet end-effector of said robot.

10. A machine having a first station for loading and unloading semiconductor wafers to and from wafer cassettes, a second station for polishing said wafers, a third station for cleaning, rinsing and drying said wafers, and means for transferring said wafers between said first, second and third stations.

11. A method for processing workpieces comprising the following steps:
    providing a workpiece to be polished, cleaned, rinsed and dried transferring said workpiece with a robot from a load/unload station to a polishing station;

polishing said workpiece;

transferring said workpiece from said polishing station to a cleaning, rinsing and drying station;

cleaning, rinsing and drying said workpiece; and transferring said workpiece with said robot from said cleaning station back to said load/unload station.

12. A load/unload station for receiving cassettes of wafers to be processed comprising:

a plurality of platforms having tilted bases thereon for supporting said cassettes, said tilted bases ensuring that said wafers slide to back portions of said cassettes; and an inner door located on an inner side of said station to isolate said station from an outside environment, and an outer door located on an outer side of said station to permit loading of said cassettes onto said platform, said inner door being configured to close before said outer door may open, and said outer door including a controlled locking mechanism to prevent opening of said outer door while said inner door is open.

13. A station as claimed in claim 12, wherein said bases have an angle of tilt in a range of five to eighteen degrees, said angle being adjustable through use of a mechanism selected from a group consisting of an elevator assembly, a servo assembly, a stepper motor and a torque motor assembly.

14. A station as claimed in claim 13, wherein said platforms further comprise cassette position sensors for monitoring whether said cassettes are properly positioned on said platforms, and outer door sensors for determining whether said outer door is open or closed.

15. A station as claimed in claim 14, wherein said platforms are configured to accommodate cassette configurations selected from a group consisting of six inch wafer cassettes, eight inch wafer cassettes, 300 millimeter wafer cassettes, and Standard Machine Interface wafer pods.

16. A station as claimed in claim 15, and further comprising ionizers to minimize accumulation of static charge in said station and HEPA filters mounted above said station to provide positive laminar air flow exclude airborne particles from said station when said outer door is open.

17. A load/unload station for supporting cassettes of semiconductor wafers to allow automated access to the wafers by an end effector of a robot, the station comprising:

a rearwardly tilted platform comprising a wafer cassette support surface adapted to support wafer cassettes; and an enclosure surrounding the platform to isolate the station from the platform and surrounding environment, the enclosure equipped with an inner door to the station that allows robot end-effector access to wafers when a cassette is on the platform, and an outer door to the surrounding environment for removing and replacing cassettes on the platform;

whereby an end-effector of a robot in the station is able to remove wafers from and replace wafers when a cassette is supported on the platform, through the inner door, while the rearward tilt of the platform prevents forward spilling of wafers from the cassette.

18. The station of claim 17, wherein the inner and outer doors are controlled to cooperate such that the inner door is closed before the outer door may be opened, to maintain isolation of the station from surroundings.

19. The station of claim 17, further comprising a plurality of platforms, the platforms accessible by a robot in the station.

20. The station of claim 17, wherein an angle of tilt of the platform is adjustable within the range of five to eighteen degrees from horizontal.

21. An automated load/unload station for containers of workpieces, the station comprising:

a robot comprising one end-effector adapted for removing workpieces from containers and another end-effector for replacing workpieces in the container, the robot located in an interior of the station and the interior isolated from surroundings; and a rearwardly tilted platform adapted for mounting containers of workpieces thereon, the platform surrounded by an enclosure, the enclosure comprising a first access door to the station interior and a second access door to the surroundings, the first access door sized to permit robot end-effector access to a container of workpieces on the platform to remove or replace workpieces, and the second door sized for removal and replacement of containers on the platform.

22. The station of claim 21, wherein the second access door is controlled to remain closed until the first access door is closed.

23. A method of using a semiconductor wafer load/unload station comprising an enclosed rearwardly tilted platform and a robot in an interior of the station, the robot having an end-effector adapted for retrieving wafers from a wafer container and replacing wafers in the container when the container is mounted on the platform, the method comprising:

placing a container of wafers on the platform and sensing secure placement, while maintaining isolation of the station interior from surroundings;

robotically removing a wafer from the container on the platform;

robotically inserting a wafer into the container; and removing the container from the platform while maintaining isolation of the station interior from surroundings.

24. The method of claim 23, further comprising providing positive pressure laminar air flow through the station to exclude contaminants.

25. The method of claim 23, further comprising precluding access to the enclosed platform from surroundings while the platform is accessible to an interior of the station.

* * * * *